United States Patent [19]
Ishida et al.

[11] Patent Number: 5,749,091
[45] Date of Patent: May 5, 1998

[54] CACHE CONTROLLER WITH INDEX STACK FOR COHERENCY FAULT TOLERANCE

[75] Inventors: Hitoshi Ishida; Minoru Shiga; Toyohito Hatashita; Yuichi Tokunaga; Hiroyuki Fukuda; Shunyo Minesaki, all of Kanagawa-ken, Japan

[73] Assignee: Mitsubishi Denki Kabushiki Kaisha, Tokyo, Japan

[21] Appl. No.: 355,093

[22] Filed: Dec. 13, 1994

Related U.S. Application Data

[63] Continuation of Ser. No. 787,246, Nov. 4, 1991, abandoned.

[30] Foreign Application Priority Data

| Nov. 5, 1990 | [JP] | Japan | 2-299487 |
| Sep. 27, 1991 | [JP] | Japan | 3-276804 |

[51] Int. Cl.⁶ .................................................. G06F 12/12
[52] U.S. Cl. .................. 711/135; 711/143; 711/144; 711/121
[58] Field of Search ................. 395/425, 575, 395/470, 462, 448, 468, 459, 471; 364/DIG. 1, 243.41, 243.42, 243.43

[56] References Cited

U.S. PATENT DOCUMENTS

| 4,142,234 | 2/1979 | Bean et al. | 395/471 |
| 4,392,200 | 7/1983 | Arulpragasam et al. | 711/140 |
| 4,638,431 | 1/1987 | Nishimura | 395/471 |
| 4,654,819 | 3/1987 | Stiffler et al. | 711/162 |
| 4,811,209 | 3/1989 | Rubinstein | 711/144 |
| 4,905,196 | 2/1990 | Kirrmann | 365/200 |
| 5,008,786 | 4/1991 | Thatte | 711/162 |
| 5,038,277 | 8/1991 | Altman et al. | 395/876 |
| 5,193,163 | 3/1993 | Sanders | 711/122 |
| 5,233,702 | 8/1993 | Emma et al. | 395/445 |
| 5,274,799 | 12/1993 | Brant et al. | 395/182.04 |

FOREIGN PATENT DOCUMENTS

| 0299511 | 1/1988 | European Pat. Off. . |
| 2210480 | of 1989 | United Kingdom . |
| 84/02409 | 6/1984 | WIPO . |

OTHER PUBLICATIONS

IEEE Computer pp. 37–45 Feb. 1988 "Sequoia: A Fault Tolerant Tightly Coupled Multiprocessor for Transaction Processing".

Logic Design and Computer Organization by Lewin Addison Wesley ©1983 pp. 168–169.

*Primary Examiner*—Tod R. Swann
*Assistant Examiner*—J. Peikari
*Attorney, Agent, or Firm*—Wolf, Greenfield & Sacks P.C.

[57] ABSTRACT

A fault tolerant computer which executes the cache flush operation at a high speed and has the real time characteristic. A processor module 301 is equipped with a cache memory so that the entry address of the updated cache block within the cache memory is stored in a stack. The cache flush is effected only with respect to the entry address in the stack when a recovery-point setting condition due to a timer or the like is satisfied. A memory module 303 has an arrangement doubled in the same storage physical space and is equipped with a buffer memory for temporarily storing the transferred cache block, so that the cache block is simultaneously transferred to a pair of buffer memories.

4 Claims, 23 Drawing Sheets

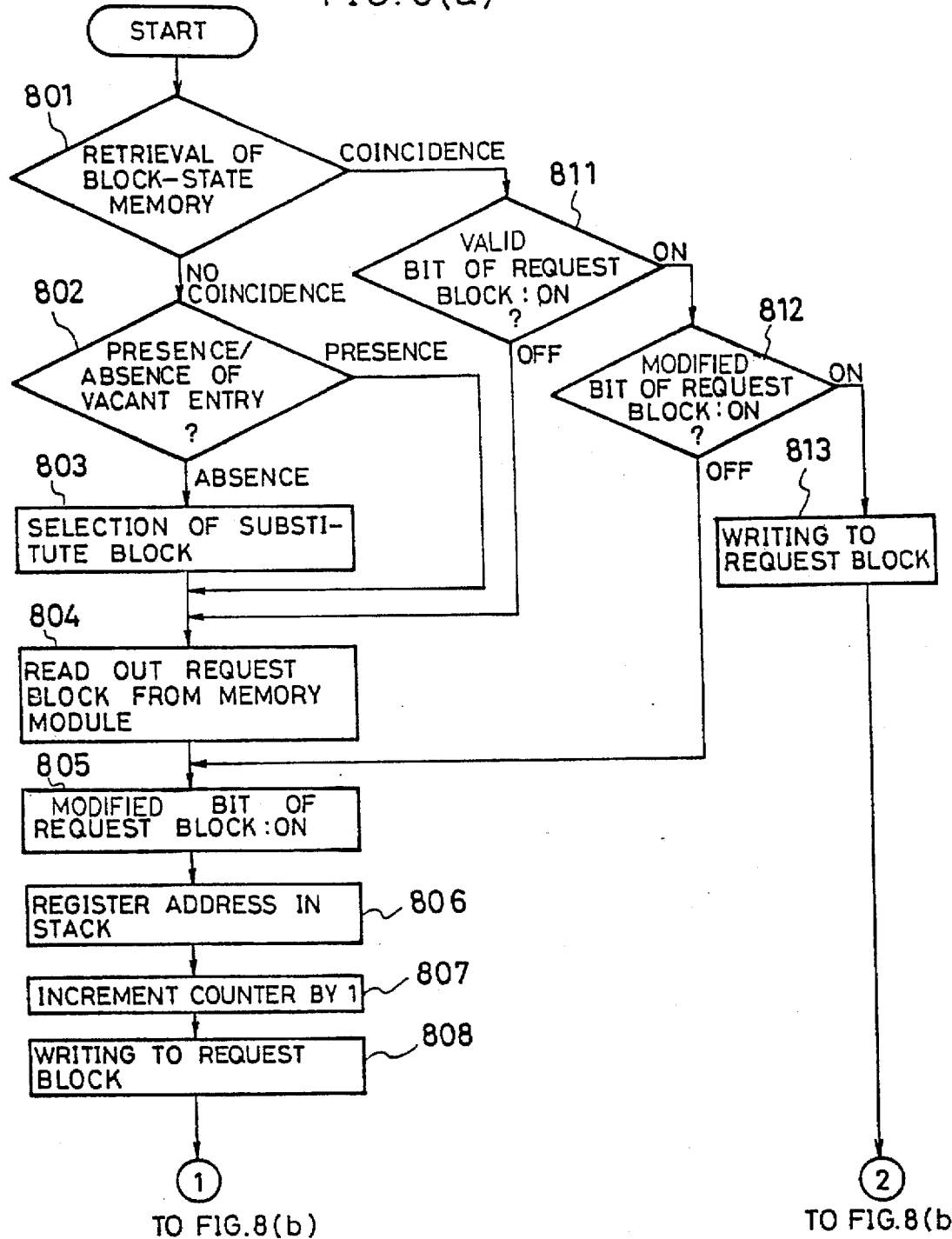

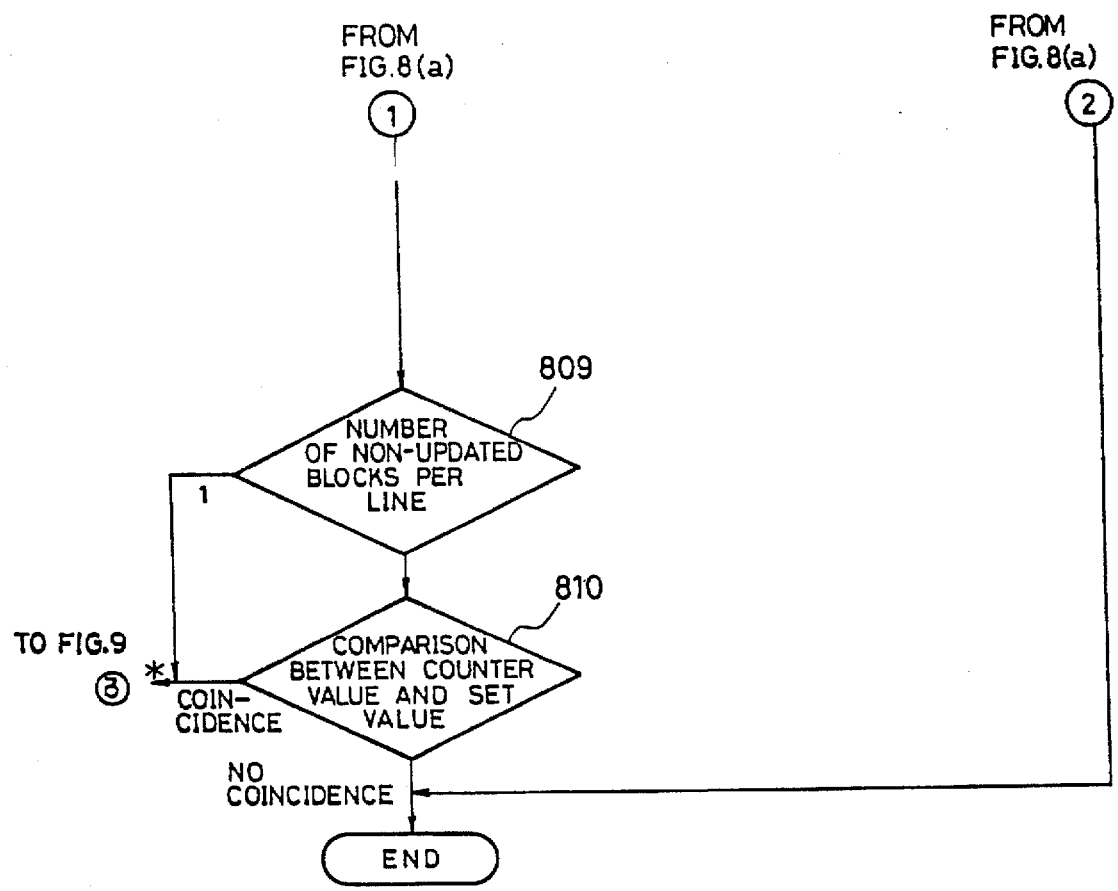

5,749,091

CACHE CONTROLLER WITH INDEX STACK FOR COHERENCY FAULT TOLERANCE

This application is a continuation of application Ser. No. 07/787,246, filed Nov. 4, 1991, now abandoned.

BACKGROUND OF THE INVENTION

1. Field of the Invention

This invention relates to a cache controller used for a multiprocessor type fault tolerant computer or the like in which each processor has a write-back type cache memory, and further relates to fault tolerant computer and a data transfer system at the time of the cache flush in the fault tolerant computer.

2. Description of the Prior Art

FIG. 15 shows a prior art cache controller of the type noted above. The Figure is shown in an article entitled "You will be familiar with 32-bit microprocessor cache", Yokota, "Nikkei Electronics", No.434, pages 159 to 174, Nov. 16, 1987. Referring to the Figure, designated at 1 is a microprocessor, at 2 is a cache controller, at 3 is a cache memory, at 4 is an interface circuit, at 5 is a system bus, at 6 is a main memory, at 7 is an address line, at 8 is a data line, and at 9 is a control line. The cache controller 2 comprises a tag memory 21, a comparator 22, a controller 23 and a bus monitor 24.

The microprocessor 1, tag memory 21, comparator 22, bus monitor 24, cache memory 3 and interface circuit 4 are connected to one another by an address line 7. The microprocessor 1, cache memory 3, and interface circuit 4 are also connected to one another by a data line 8. The microprocessor 1, controller 23, bus monitor 24, cache memory 3 and interface 4 are connected to one another by a control line 9. Further, the controller 23, tag memory 21, controller 23, and cache memory 3 are connected to one another by control lines 9a and 9b. The system bus 5 and bus monitor 24 are connected to each other directly by an address line 7a and control line 9c, that is, not through the interface circuit 4. The memory 21 and comparator 22 are connected to each other by an address controller 7c, and the controller 23 and bus monitor 24 are connected to each other by an address line 7d.

Now, the operation will be described.

The microprocessor 1 supplies a request for accessing the main memory 6 to the tag memory 21 and comparator 22. In tag memory 21, address of data in the cache memory 3 and bits indicative of the nature of the data (such as effectiveness and alteration) are held for each cache block.

A description will be made hereinbelow with reference to FIG. 16 in terms of the case that a request of the microprocessor 1 is a read request. First, a check is executed as to whether there is requested data in the cache memory 3 (1601). If there is an address matched to the tag memory 21, the valid bits of the cache block are checked (1608). If the valid bit of the cache block containing that data is "ON", the data is read out from the cache memory 3 (1607). If the valid bits of the cache block are "OFF", a newest value is read out from the main memory 6 or a different module into the cache block(1606), and also data is supplied to the microprocessor 1 (1607). Meanwhile, if no entry is found in the cache memory 3, a check is executed as to whether there is a vacant block in the cache memory (1602). If there is a vacant block, a block having data required for the block is read out (1606), and also data is supplied to the microprocessor 1 (1607). If there is no vacant block, a substitute block is selected (1603), and modified bit of the selected cache block is checked (1604). If the modified bit is "ON", the pertaining cache block is written back in the main memory 6 (1605). Then, a block having data requested for the written-back cache block is read out (1606), and also data is supplied to the microprocessor 1 (1607). If the modified bit in the substitute block is "OFF", data required for the block are read out from the main memory 6 or a different module (1606), and also data is supplied to the microprocessor 1 (1607).

Secondly, a description will be made hereinbelow with reference to FIG. 17 in terms of the case that a request supplied from the microprocessor 1 is a write request. First, a check is executed as to whether there is request data in the cache memory 3 (1701). If there is an address matched to the tag memory 21, valid bit of that cache block is checked (1709). If the valid bit of the cache block having that data is "ON", modified bit of the cache block is checked (step 1710). If the modified bit is also "ON", the microprocessor 1 writes data in the cache block (1708). If the cache block valid bit is "ON" and the modified bit is "OFF", the modified bit in the cache block is made to be "ON" (1707), and also data is written in the cache memory 3 (1708). If the valid bit of the matched cache block is "OFF", a newest value is read out from the main memory 6 or different module into the same cache block (1706), and after the modified bit is made to be "ON" (1707), data is written (1708). If there is no entry in the cache memory 3, a check is executed as to whether there is a vacant block in the cache memory 3 (1702). If there is a vacant block, a block having data required for the block is read out (1706), and after the modified bit is made to be "ON" (1707), data is written (1708). If there is no vacant block, a substitute block is selected (1703), and the modified bit of the substitute block selected is checked (1704). If there is an "ON" modified bit, that block is written back in the main memory 6 (1705). Then, a block containing data required for the written-back block is read out (1706), and after the modified bit is made to be "ON" (1707), the data is written (1708). In the case that the modified bit of the substitute block is made to be "OFF", the data required for that block is read out from the main memory 6 or a different module (1706), and after the modified bit is made to be "ON" (1707), data is written (1708).

The bus monitor 24 includes an internal tag memory which is matched to the tag memory 21. The operation of other microprocessors on the system bus 5 is monitored. If a bus cycle due to a read error, a write hit or a write error is detected, the pertinent address is compared to the contents of the internal tag memory. in case of a read error, if the tag memory matches the address and the valid and modified bits are respectively "ON", the cache controller 2 provides data to the module requiring that cache block and/or the main memory 6, and then the modified bit is made to be "OFF". If the modified bit is "OFF", the cache controller executes no operation.

In case of a write hit, if the tag memory matches the address, a valid bit of that cache block is made to be "OFF".

In case of a write error, if the tag memory matches the address and there are "ON" valid and modified bits, as in the case of read error, data is provided, and then the "ON" valid bit of that block is set to be "OFF".

Among the above situations, in case when a updated cache block is substituted and a case when updated data is referred to by a different microprocessor, a recovery point is set. The term "recovery point" for a given processor means a point to which the routine of the given processor returns for restoring and resuming the process of the given processor following error recovery. At the recovery point, the controller 23 checks all the modified bits of the tag memory 21, and all the updated cache blocks in the cache memory 3 are written back in the main memory 6 (which will be referred to as a cache flush). When the writing-back is completed, the modified bits of the cache block are made to be "OFF".

On the other hand, FIG. 18 is a block diagram showing an arrangement of a conventional fault tolerant computer exemplified by description in U.S. Pat. No. 4,819,154. In the illustration, 1801 represents the same processor module including a processor for executing both user and supervisor programs, 1802 designates a system bus doubled in order to improve the reliability and throughput, and 1803 denotes a memory module for storing program/data of user/supervisor. Although the system bus 1802 is sufficient to be constructed as a single bus, it is arranged to be doubled so as to prevent stop of the operation of the entire system due to troubles in the bus to improve the system throughput. Although being illustrated by one line in FIG. 18, the system bus 1802 is actually constructed as a multi-wire bus comprising a number of data and signal lines. The data to be stored in the memory module is also stored in physically different two memory modules for the countermeasures against fault.

FIG. 19 shows a more detailed arrangement of the processor module. In the illustration, 1901 represents a memory managing unit for converting a virtual address into a physical address, 1902 designates a processor for implementing user/supervisor programs, 1903 depicts a local address bus, 1904 denotes a local data bus, 1905 indicates a bus adapter for checking the parity of the data from a cache memory to the local data bus to produce a byte parity with respect to the data from the local data bus to the cache memory, 1906 is a cache address bus. Further, 1907 represents an internal control sequencer, 1908 designates a cache memory which is not of the write-through type (that is, a write-back type cache memory), 1909 depicts a cache data bus, 1910 denotes a block-state memory (having a similar structure to the tag memory 21 in the FIG. 15), 1911 is an external control sequencer, 1912 indicates a data bus, and 1913 represents a system bus interface. The processor module completely has the same structure and is treated similarly.

FIG. 20 is an illustration of a more detailed arrangement of the memory module. In the illustration, 2001 represents a system bus interface, 2002 depicts an internal address bus, 2003 designates encoder/decoder, 2004 is a control sequencer for producing a control signal and a synchronizing signal for sequencing the memory module, 2005 is an address detector/producer for decoding address to detect the address to which the corresponding memory module is responsive, 2006 indicates a RAM timing/control unit for producing a row address, column address and a chip selection signal, and 2007 is a RAM array.

Secondly, a description will be made hereinbelow in terms of the operation. The memory access request from the processor 1902 is processed in the internal control sequencer 1907. The internal control sequencer 1907 checks, with reference to the block-state memory 1910, whether the requested data is present in the cache memory 1908. In the case that the request of the processor 1902 is a read request and the requested data is present in the cache memory 1908, the data is immediately supplied from cache memory 1908 to the processor 1902. In cases where the requested data is absent in the cache memory 1908 or the data is invalid, after the address conversion is effected in the memory managing unit 1901, the address is transferred through the external control sequencer 1911 and the system bus interface 1913 to the memory module. The memory module is responsive to the transfer of the cache block including the requested data. The transferred cache block is supplied to the processor 1902 and, at the same time, stored in the cache memory 1908.

Let it be assumed that the request of the processor 1902 is a write request and the requested data is present in the cache memory 1908. In the case that the cache block including the data has already been updated, the writing is performed immediately. On the other hand, in the case that the cache block is not updated, the bit in the block-state memory 1910 which corresponds to the cache block and which indicates the completion of the update is changed before performing the writing operation. Further, in cases where the requested data is absent in the cache memory 1908 or the data is invalid, after the address conversion in the memory managing unit 1901, the address is supplied through the system bus interface 1913 to the memory module. The memory module is responsive to the transfer of the block including the requested data. The supplied data block is updated after supplied to the processor 1902 and then written in the cache memory 1908. At that time, the block-state memory 1910 is also updated.

Since the prior are apparatus has the cache memory 1908 which is not of the write-through type (that is, which is of the write-back type), the data in the cache memory is not always coincident with (or matched to) the data in the memory module. In addition, as recovering countermeasures against the occurrence of trouble is taken a method in which the state that the system operates normally is kept (which is referred to as a recovery point) so that the process is resumed from the latest recovery point in the memory module in response to the occurrence of trouble. Accordingly, in the case that the recovery point is set, it is necessary that the internal register information in the processor is written in the cache memory and all the cache blocks updated locally in the cache memory are written in the memory module (which is referred to as a cache flush) so that the cache memory is coincident in data with the memory module. In the prior art apparatus, in response to the overflow in the context and cache memory, the occurrence of the overflow is detected to perform the cache flush operation.

The operation effected at the time of the cache flush will be described hereinbelow with reference to FIG. 21. In response to the occurrence of the cache flush, the processor 1902 starts the cache flush operation with respect to the internal control sequencer 1908. The internal control sequencer 1908, at every entry of the block-state memory 1910, fetches the bit representative of whether the cache block is updated or not (2101) and checks it by means of the comparator within the internal control sequencer 1908 (2102). If the modified bit is "ON", the data block corresponding to that entry is fetched from the cache memory 1908 (2103) and is transferred through the system bus interface (1913) to the memory module (2104). After the transfer, the flush address is incremented (2105) so as to be compared with the termination address (2106). If not exceeding the termination address, the operational flow returns to the process 2101 to repeat the processes. If the modified bit of the cache block is "OFF", the flush address is incremented (2105). If not exceeding the termination address, the operational flow returns to the process 2101 to repeat the processes.

In the prior art apparatus, the above-mentioned cache flush operation is performed in unit of the doubled memory modules. The cache flush operation is effected two times so that correct data is always presented in one of the memory modules. First, the cache flush operation is performed with respect to one of the memory modules. In the cache flush operation, the cache block is directly written through the system bus interface 2001 or encoder/decoder 2003 to the RAM array 2007. In the system bus interface 2001 or encoder/decoder 2003, the parity check, error detection and correction process are performed with respect to the data block. When the first cache flush is succeeded, the cache flush is performed with respect to the other memory module. When the second cache flush operation is normally completed, the processor module resumes the process before the cache flush.

If a trouble occurs in the first cache flush operation, the process is resumed from the newest recovery point which has previously been kept in the other memory module. For the recovery, the memory module in which the trouble occurs copies the contents of the one memory module. In response to a trouble occurring in the second cache flush operation, the process is implemented using the data within the memory module which has been updated by the first cache flush. In case that a trouble generates during the second cache flush, a storage area is reassigned on a different memory module and the contents are copied in that area for the recovery.

With the prior art cache controller having the construction as described above, when a recovery point is set, it is necessary to execute once a retrieval of cache address tags for writing back all the updated cache blocks in the cache memory. Consequently, a processing of writing back all the updated cache blocks, i.e., a cache flush process, takes a long time.

Similarly, since the prior art fault tolerant computer is arranged as described above so that all the updated cache blocks in the cache memory are transferred to the memory module in response to start of the cache flush operation, the updated cache block is required to be searched by retrieving all the entries of the block-state memory, thereby taking a long time for the cache flush operation.

In addition, since in the conventional apparatus the setting interval of the recovery points is unspecified, difficulty is encountered to specify the time required until resuming the process through the recovery after the detection of a trouble and hence to keep the real time operation.

Furthermore, in the conventional apparatus the data transfer from the cache memory is required to be performed two times in the cache flush operation because of being transferred to the two memory modules, and therefore there is a problem that the bus load is increased to sacrifice the system performance.

Moreover, since in the prior art apparatus all the cache blocks updated in the cache flush operation are transferred to the memory module, it is required to repeatedly perform the transfer transaction at every cache block, and hence there is a problem that the system bus load is increased so as to sacrifice the system performance.

SUMMARY OF THE INVENTION

The present invention has been intended to solve the above problems, and its object is to provide a cache controller, which permits high speed cache flush.

Another object of the present invention is to execute the cache flush operation at a high speed to obtain a fault tolerant computer with a real time function.

A further object of the present invention is to provide a data transfer system which is capable of reducing the system bus load at the time of the cache flush operation.

According to the present invention, there is provided a cache controller, which comprises storage means for storing the entry address of a updated cache block, and control means for causing the entry address of the updated cache block to be registered in the storage means and also causing the cache flush transfer to be effected with respect to the registered entry address with reference to the storage means at the time of the cache flush operation.

In addition, according to this invention, there is provided a processor module of a fault tolerant computer comprising storage means for storing the entry address of the updated cache block and control means for registering the entry address of the updated cache block in the storage means and further for transferring to a memory module, in a cache flush operation, the cache blocks corresponding to the entry addresses associated with all updated blocks in a given cache memory.

Further, there are provided a timer for counting the elapse time and the number of the updated cache blocks in order to set the recovery point, and a bus monitoring circuit for monitoring the system bus.

Moreover, according to this invention, there is provided a memory module of a fault tolerant computer which is composed of communication means doubled in the same storage physical space for establishing a communication between a pair of memory modules and a buffer memory disposed for each memory module, and control means for controlling the buffer memory and the communication means.

Furthermore, according to this invention, for performing the cache flush operation at a high speed, there is provided a data transfer system which includes cache flush information means for giving an instruction with respect to all the memory modules which in turn make preparation for the reception of the cache flush, cache block transferring means for transferring the address and data at every cache block and for continuously effecting the transfer of all the updated cache blocks, and response means for returning the received cache block from the last stored memory module to the processor module.

In the cache controller according to this invention, the control means registers the entry addresses of updated cache blocks in the storage means such as a stack, and when effecting cache flush, i.e., when writing back all the updated cache blocks, the control means refers to the storage means to thereby obtain the entry address of a cache block to be written back with a short time.

Similarly, in the fault tolerant computer arranged as described above, the control means stores and registers in the storage means the entry address of the cache block to be initially written at the time of the processor writing operation and reads out the registered entry address from the storage means in the cache flush required for the setting of the recovery point so as to transfer the corresponding cache block to the memory module.

Further, the setting of the recovery point is started in response to the generation of the interrupt to the processor occurring under the condition that the control means of the cache memory detects that the number of the cache blocks which are not updated in the respective cache lines of the cache memory reaches a predetermined value, the counter detects that the total number of the updated cache blocks within the cache memory reaches a predetermined value, the bus monitoring circuit detects that a different processor module refers through the system bus to the locally updated cache block within the cache memory, or the timer detects that any one of the aforementioned detections is not made within a predetermined time period.

Here, in the pair of memory modules, the buffer memory temporarily stores the received cache block, and after the completion of the reception, the control means confirms the status for the synchronism between the pair of memory modules to write data from the buffer memory to the RAM array through the communication means.

In addition, in response to the instruction of the cache flush from the processor, the cache flush information means informs all the memory modules that the cache flush is started, and the cache block transfer means continuously transfers the data and address of the cache block with respect to all of the updated cache blocks. Further, the response means makes effective only the response from the memory module in which the data is finally written in the RAM array.

The above and other objects, features and advantages of the invention will become more apparent from the following description when taken in conjunction with the accompanying drawings.

BRIEF DESCRIPTION OF THE DRAWINGS

FIGS. 8A and 8B show a flow chart showing the operation of the FIG. 4 embodiment to be executed in response to the write request of a processor;

DESCRIPTION OF THE PREFERRED EMBODIMENT

Embodiment 1

Figure 1:
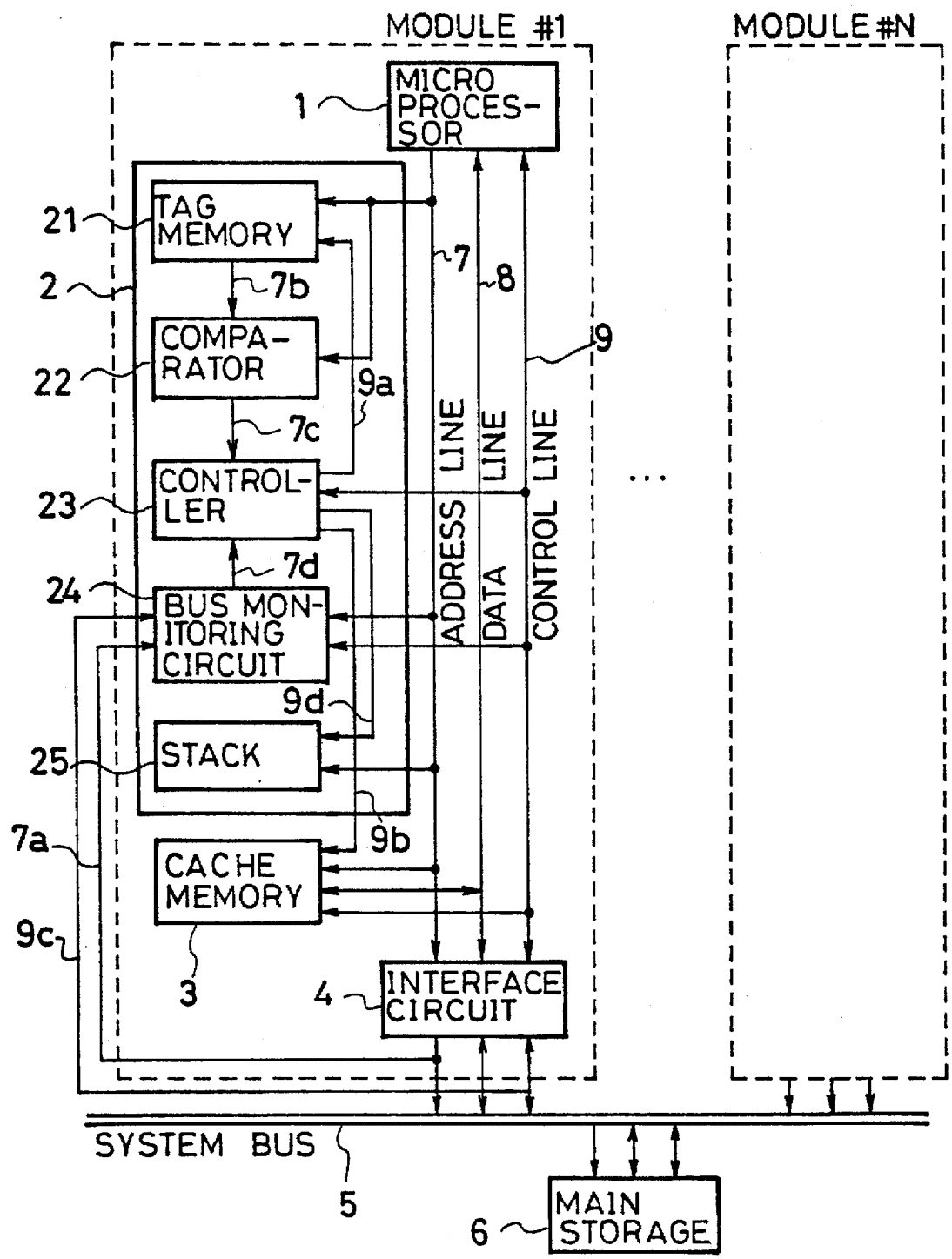
FIG. 1 is a block diagram showing an arrangement of a cache controller according to an embodiment of the present invention.
Figure 15:
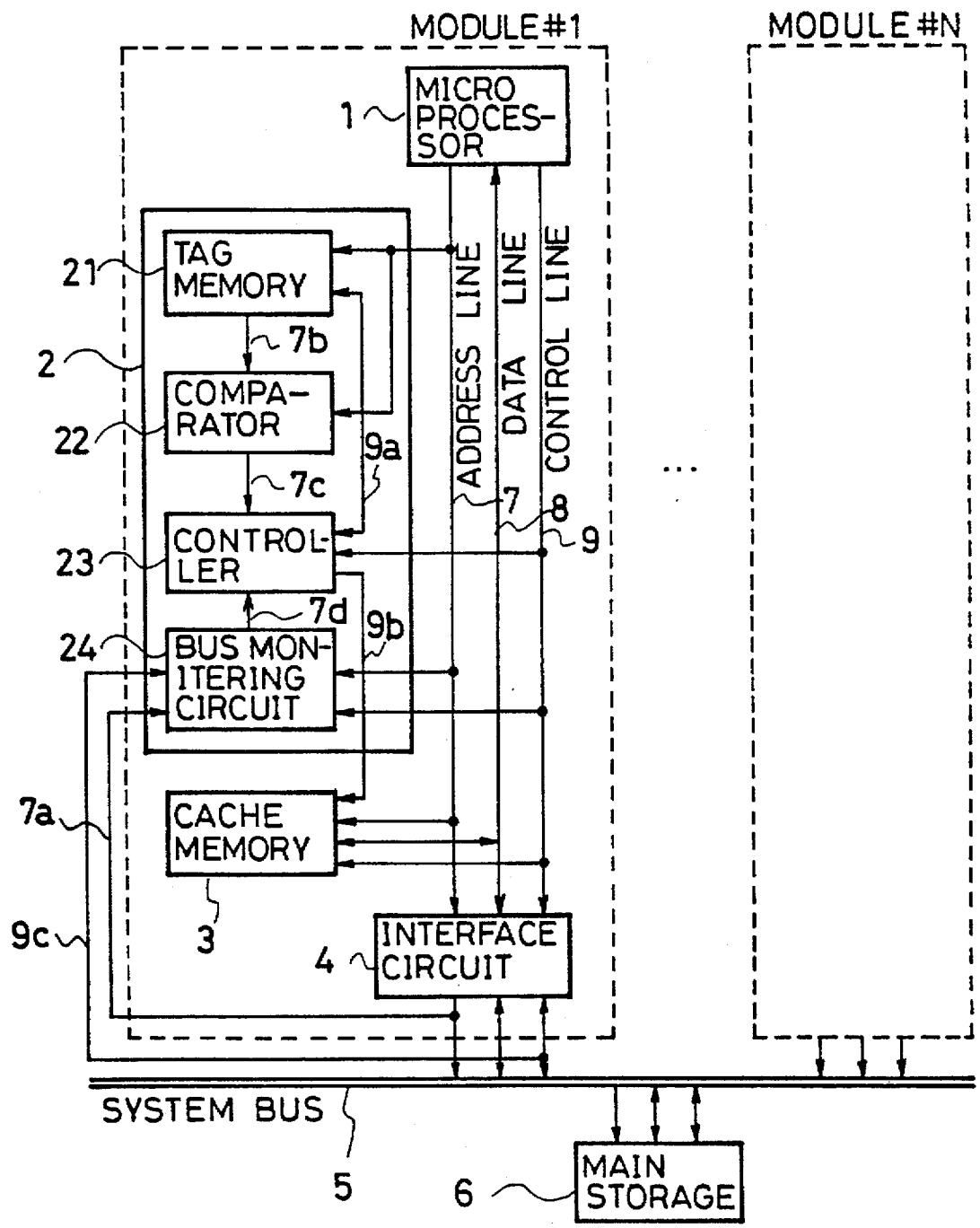
FIG. 15 is a block diagram showing an arrangement of a prior art cache controller.

FIG. 1 is a block diagram showing an arrangement of a cache controller according to an embodiment of the present invention where parts 1 to 9 and 21 to 24 are similar to those in the prior art cache controller shown in FIG. 15.

Designated at 25 in the Figure is a stack constituted by a FIFO (First-In First-Out). The stack corresponds to the storage means in the present invention. The stack 25 and controller 23 are connected to each other by a connection line 9d. This controller 23 realizes control means in the present invention. A microprocessor 1, a tag memory 21, a comparator 22, a bus monitor 24, a cache memory 3, an interface circuit 4 and the stack 25 are connected to one another by an address line 7.

Operation will now be described.

Figure 16:
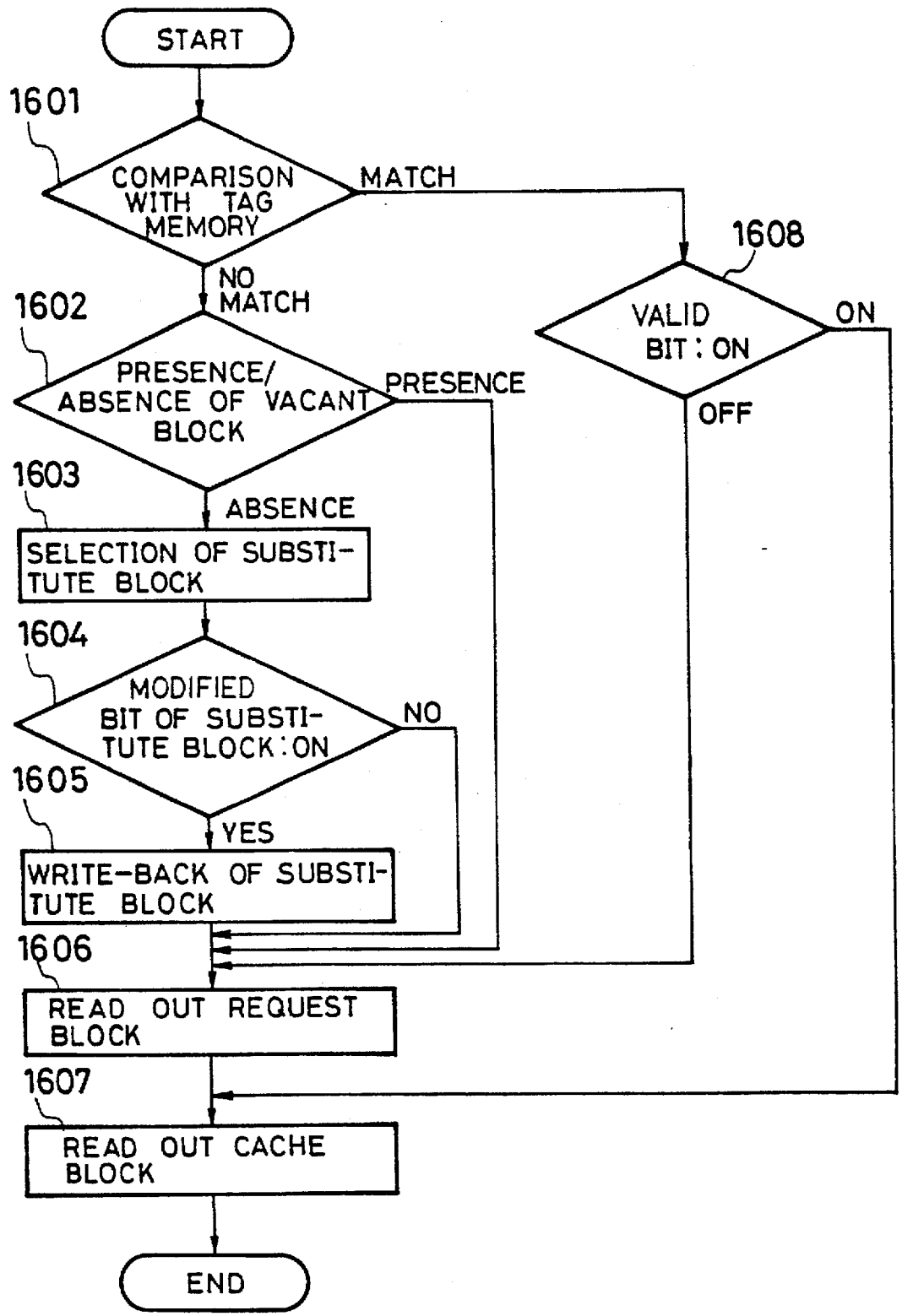
FIG. 16 is a flow chart illustrating the operation of the FIG. 15 prior art cache controller at the time of reading data.
Figure 17:
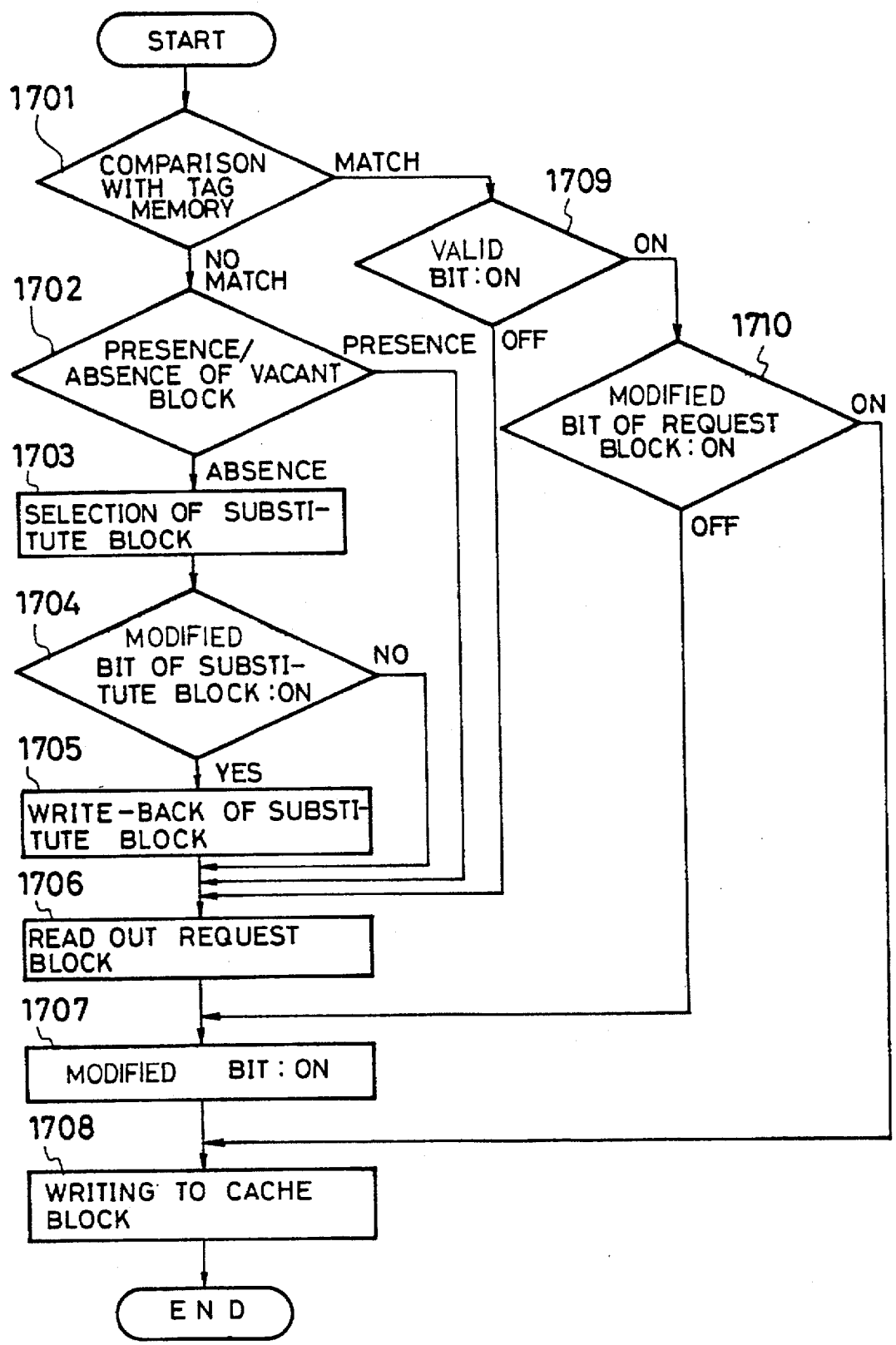
FIG. 17 is a flow chart illustrating the operation of the prior art cache controller at the time of writing data.
Figure 18:
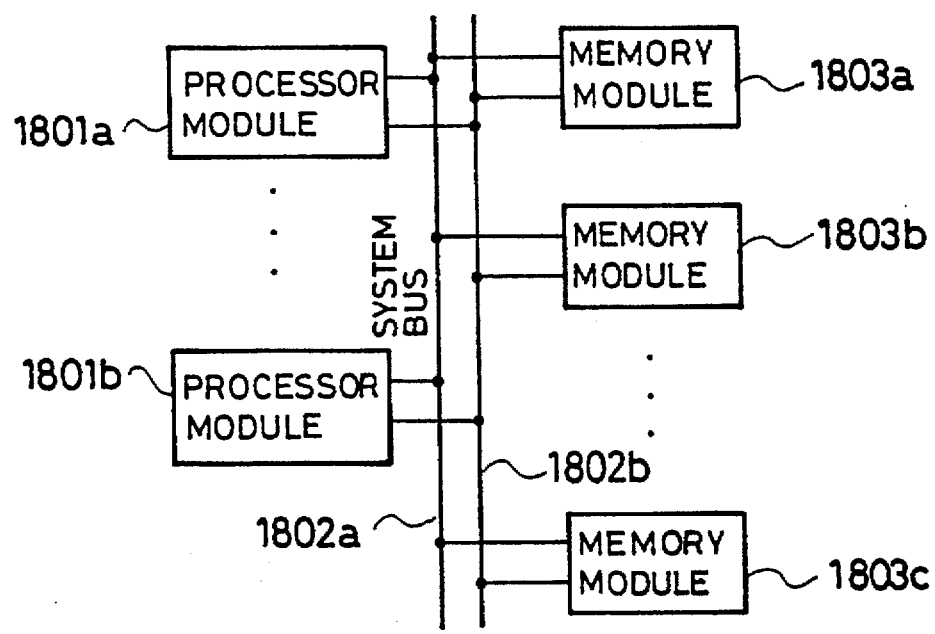
FIG. 18 shows an arrangement of a conventional fault tolerant computer.
Figure 19:
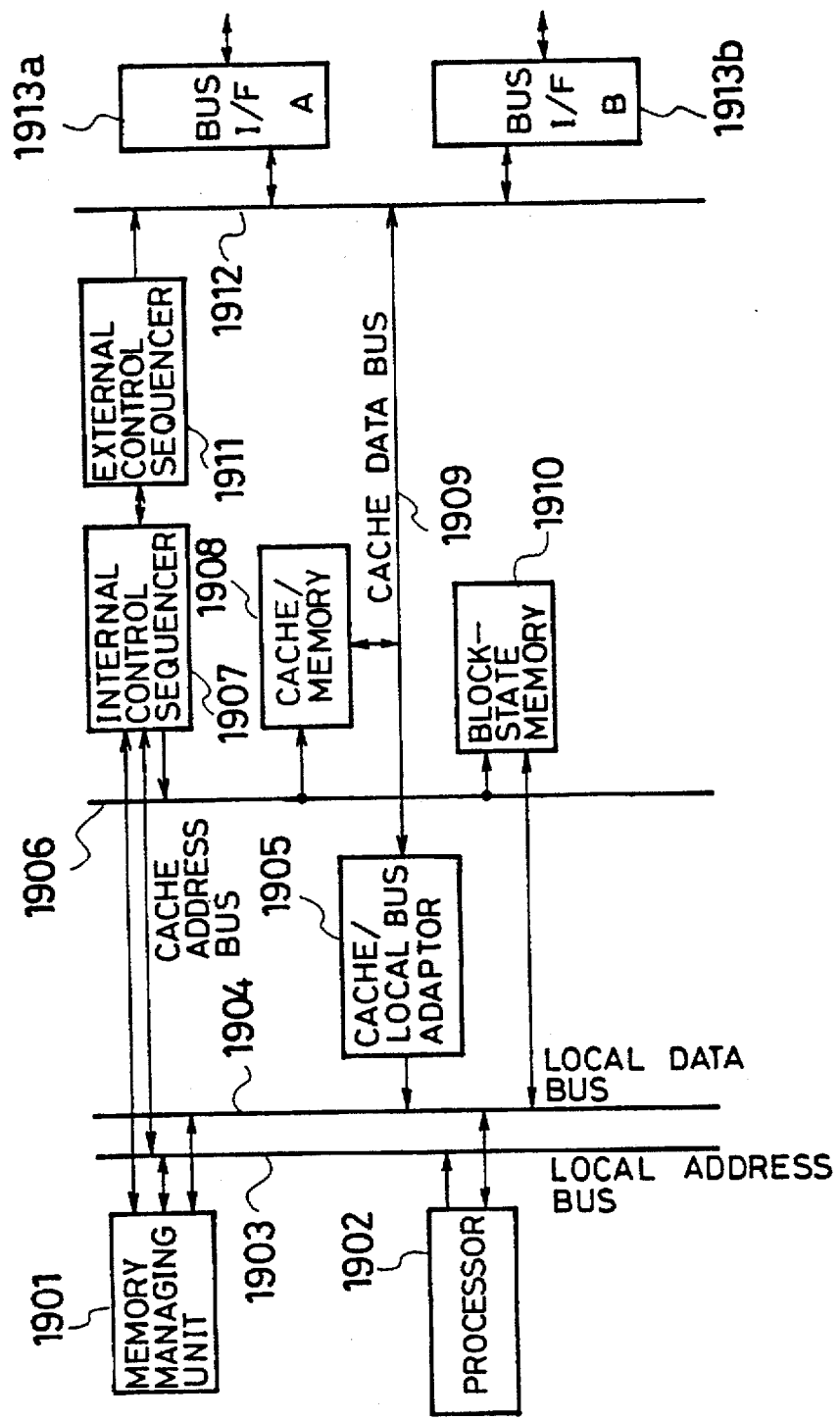
FIG. 19 illustrates a detailed arrangement of a processor module in the FIG. 18 computer.
Figure 20:
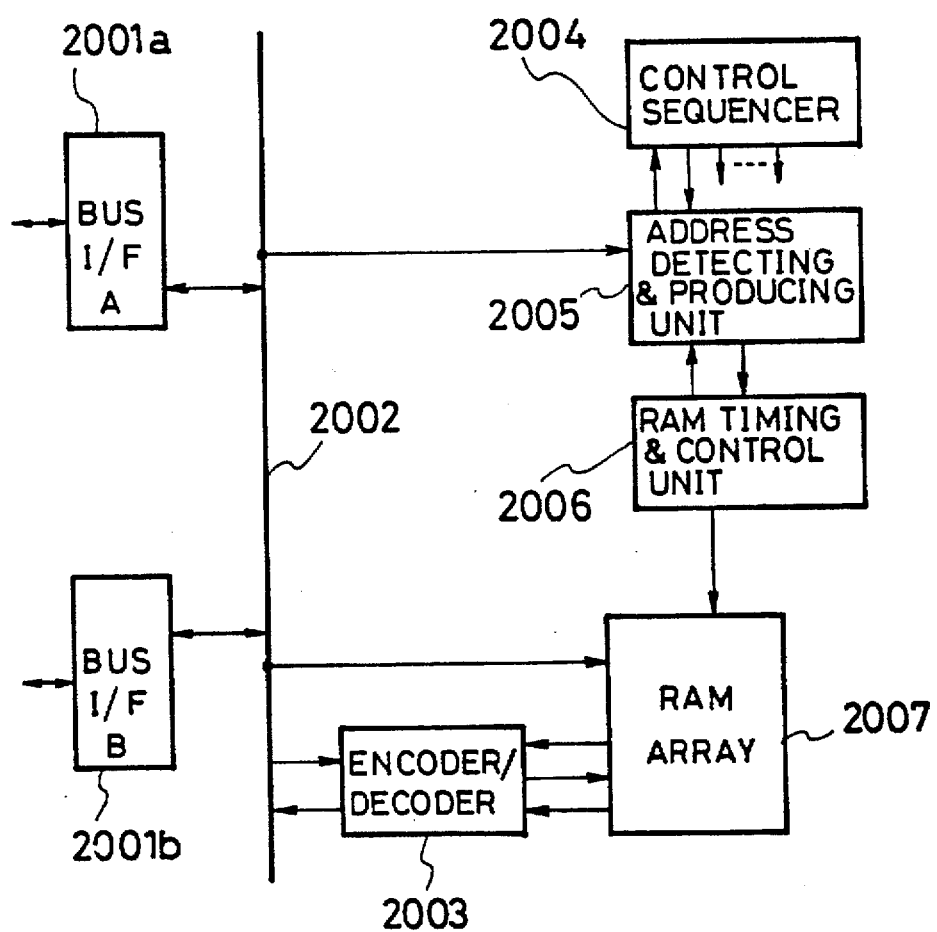
FIG. 20 shows a detailed arrangement of a memory module in the FIG. 18 computer.
Figure 21:
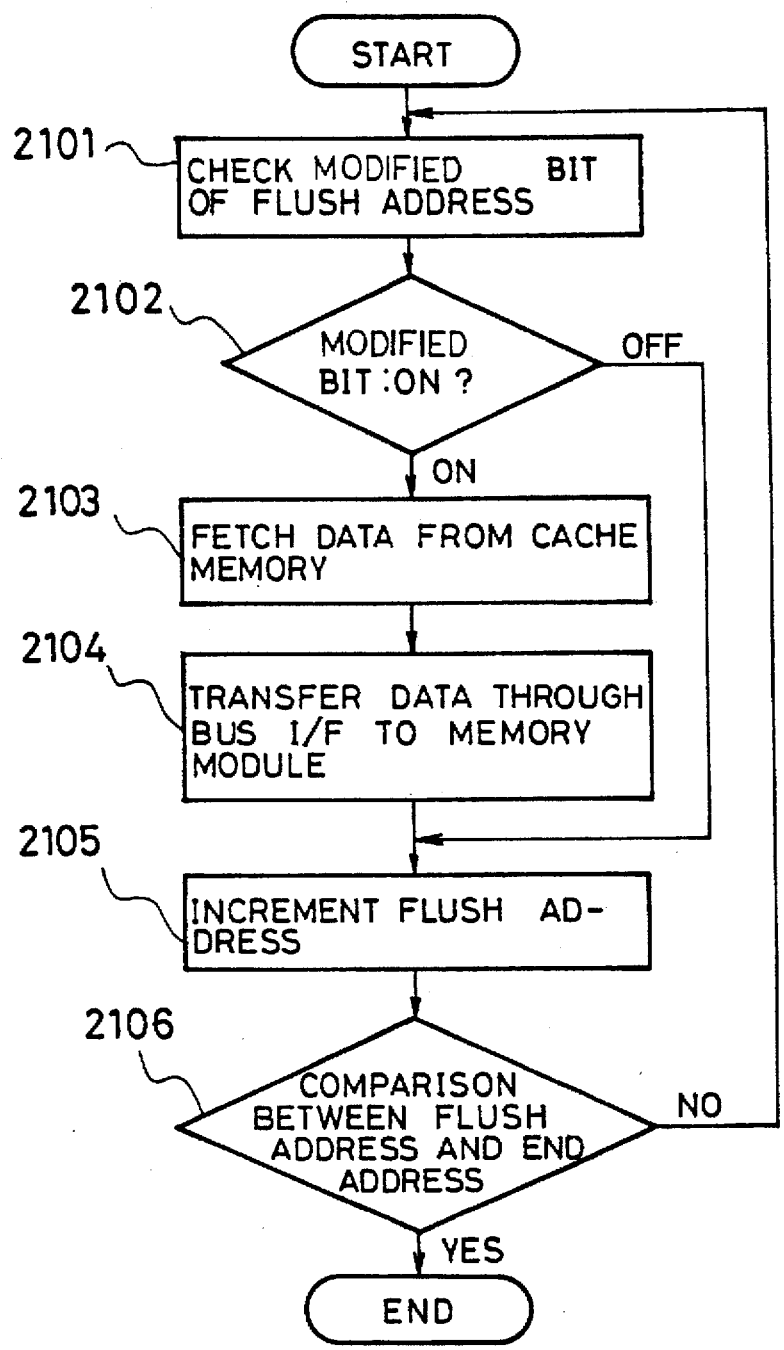
FIG. 21 is a flow chart showing the cache flush operation in the FIG. 18 computer.

The operation is the same as in the prior art structure so far as read request of the microprocessor 1 is concerned (see FIG. 16).

Figure 2:
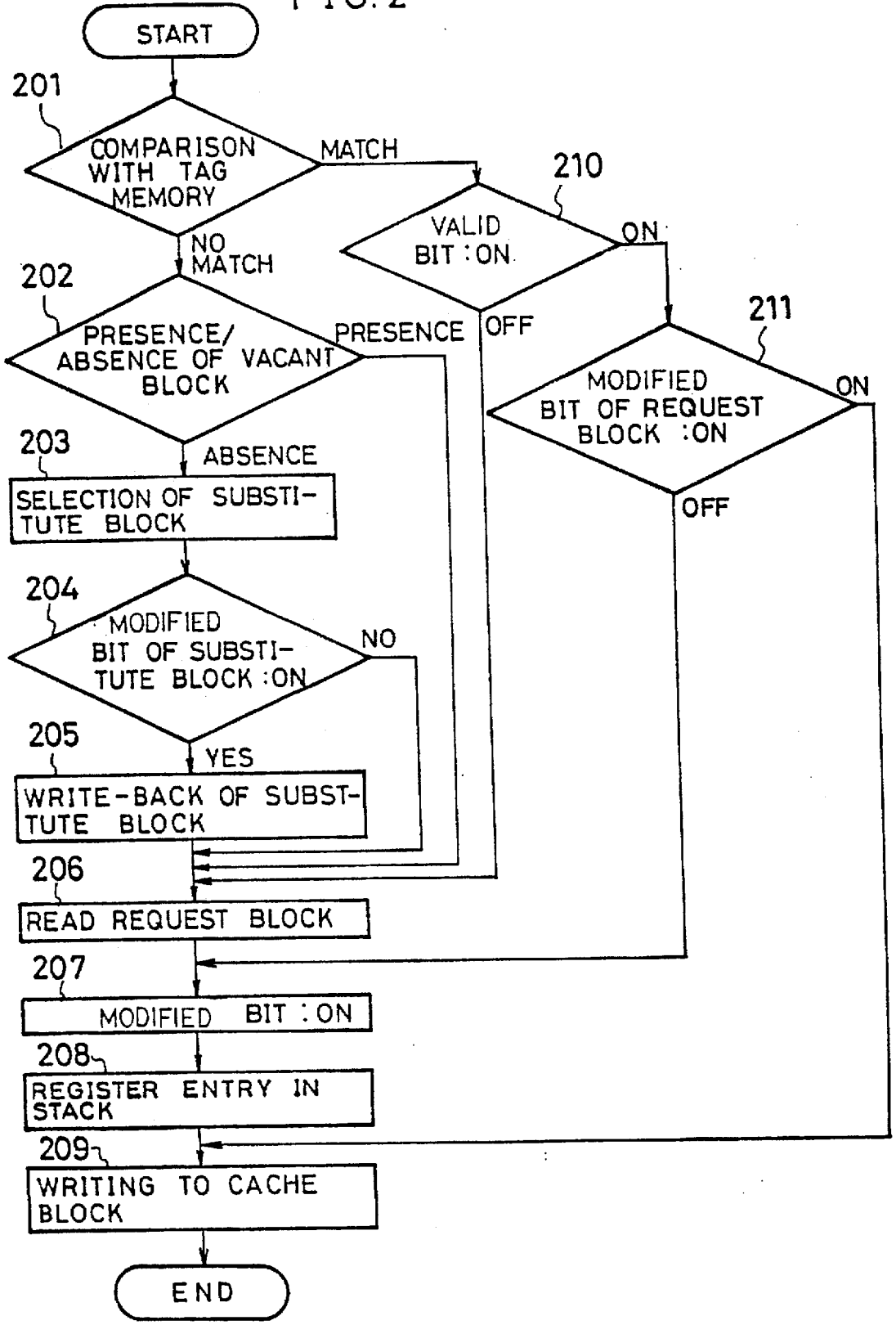
FIG. 2 is a flow chart illustrating the operation of the FIG. 1 embodiment at the time of writing data.

A case when a request supplied from the microprocessor 1 is a write request will now be described with reference to FIG. 2. First, a check is done as to whether the request data is contained in the cache memory 3 (step 201). If there is an address matching the tag memory 21, valid bits of that cache block are checked (step 210). If there is an "ON" valid bit of a cache block containing that data, modified bits of that cache block are checked (step 211). If there is an "ON" modified bit, the microprocessor 1 writes data in that cache block (step 209). If there is an "ON" valid bit of cache block and also an "OFF" modified bit, the modified bit of that cache block is made to be "ON" (step 207), and also the entry address of that cache block is registered in the stack 25 (step 208). Further, data is written in the cache memory 3 (step 209). Further, if valid bits of the matched cache block are "OFF", a newest value is read out from the main memory 6 or a different mode into the same cache block (step 206), a modified bit is made to be "ON" (step 207), and entry address is registered in the stack 25 (step 208). Then, data is written (step 209). If there is no entry in the cache memory 3, a check is executed as to whether there is a vacant block in the cache memory 3 (step 202). If there is a vacant block, a block containing data requested for that block is read out (step 206), a modified bit is made to be "ON" (step 207), and entry is registered in the stack 25 (step 208). Then, data is written (step 209). Further, if there is no vacant block, a substitute block is selected (step 203), modified bits of the selected substitute block are checked (step 204). If there is an "ON" modified bit, that block is written back in the main memory 6 (step 205). Then, a block having data requested to the written-back block is read out (step 206), a modified bit is made to be "ON" (step 207), and an entry address is registered in the stack 25 (step 208). Then, data is written (step 209). If the modified bits of the substitute block are "OFF", data required for that block is read out from that main memory 6 or a different module (step 206), a modified bit is made to be "ON" (step 207), and then an entry address is registered in the stack 25 (step 208). Then, data is written (step 209). It has been described that steps 201 to 209 occur in succession. However, it is possible to provide for such parallel processing that a modified bit is made to be "ON" (step 207) simultaneously with registration of an entry address in the stack 25 so as to write in the cache block.

The operation of the bus monitor 24 is the same as in the prior art structure.

As in the prior art structure, a recovery point is set when substituting for a updated cache and when reference to updated data is made by other microprocessor. At the recovery point, the controller 23 causes writing-back of only entry address of the cache blocks registered in the stack 25 with reference to the stack 25. In such case, with the prior art structure, it has been necessary to conduct once a retrieval of cache address tags. With the present embodiment, in contrast, this is unnecessary, and thus time required for cache flush can be greatly reduced.

Here, although in the above embodiment the FIFO memory is used for the stack 25, it is appropriate to constitute it with a static memory.

Embodiment 2

Figure 3:
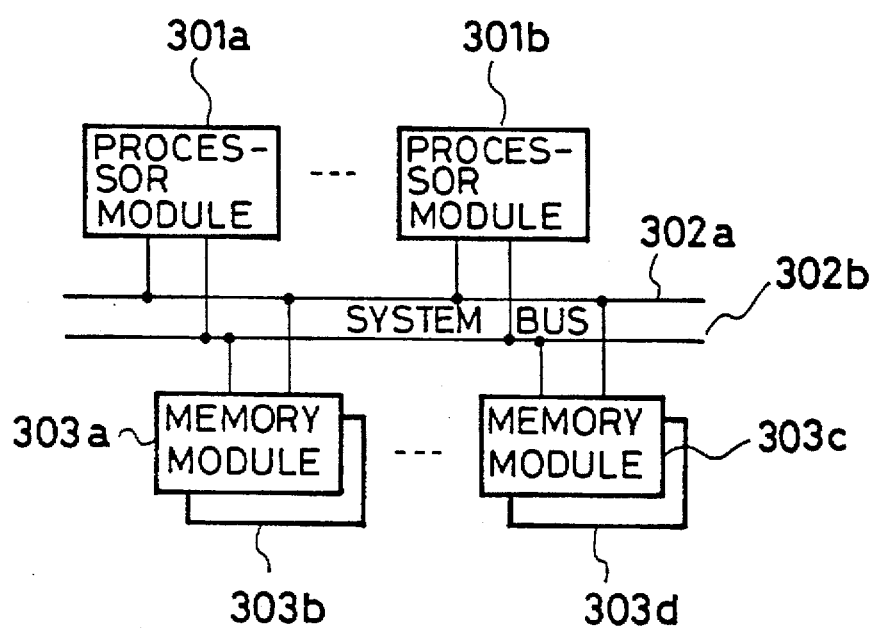
FIG. 3 is a block diagram showing an arrangement of a fault tolerant computer according to an embodiment of the present invention.

FIG. 3 shows an arrangement of a fault tolerant computer according to this invention. In the illustration, 301 represents a processor module, 303 designates a memory module, and 302 is a system bus for connection therebetween. The processor module 301 is constructed with a M×N (M and N are integers equal to or more than 1) backup arrangement comprising M current systems and N spare (backup) systems. The processor module which is of the spare system succeeds the interrupted process in case that the current system processor fails. The processor modules have the same structure irrespective of being the current systems and spare systems. Although it is sufficient for the system operation even if being constructed as a single bus, the system bus 302 has a doubled arrangement in order to prevent the operation of the entire system from being stopped due to troubles in the bus. In FIG. 3, although being illustrated as a single line, the system bus 302 is actually constituted with an address/data bus, a synchronizing bus and a control bus. The address/data bus is a bus composed of a plurality of signal lines for transferring the address which designates the memory address to store the data and also for transferring the data to be stored in that address. The synchronizing bus is for transferring a handshaking signal in order to take the synchronism for the address and data transfer and comprises address-transfer synchronizing AS*, AK*, AI* and data-transfer synchronizing DS*, DK*, DI* (* designates a negative logical signal). The control bus is for transferring the address, data and necessary information other than the synchronizing signal, and comprises CT* for giving the information of the bus transaction of the cache flush, BS* for giving the information that it is impossible to perform the request transaction because one of the memory modules is in a different operation, EB* for indicating the last data transfer of one cache block data, and IR* whereby one memory module, which is in operation, requires the invalid of the response with respect to the other memory module which generates the response indicative of the completion of the process in the data transfer process from the FIFO buffer to the RAM array. These buses are coupled through a bus interface to the processor/memory modules. Although in this embodiment the system bus is doubled, the two buses are arranged to effect the same operation and therefore the following description will be made in terms of the operation of one bus for brevity.

The memory module 303 is arranged to be doubled so as to comprise a master and a slave which have the same physical storage space (in FIG. 3, 303a and 303b, 303c and 303d) and which are disposed on physically different substrates so as to be used for a plurality of processor modules.

Figure 4:
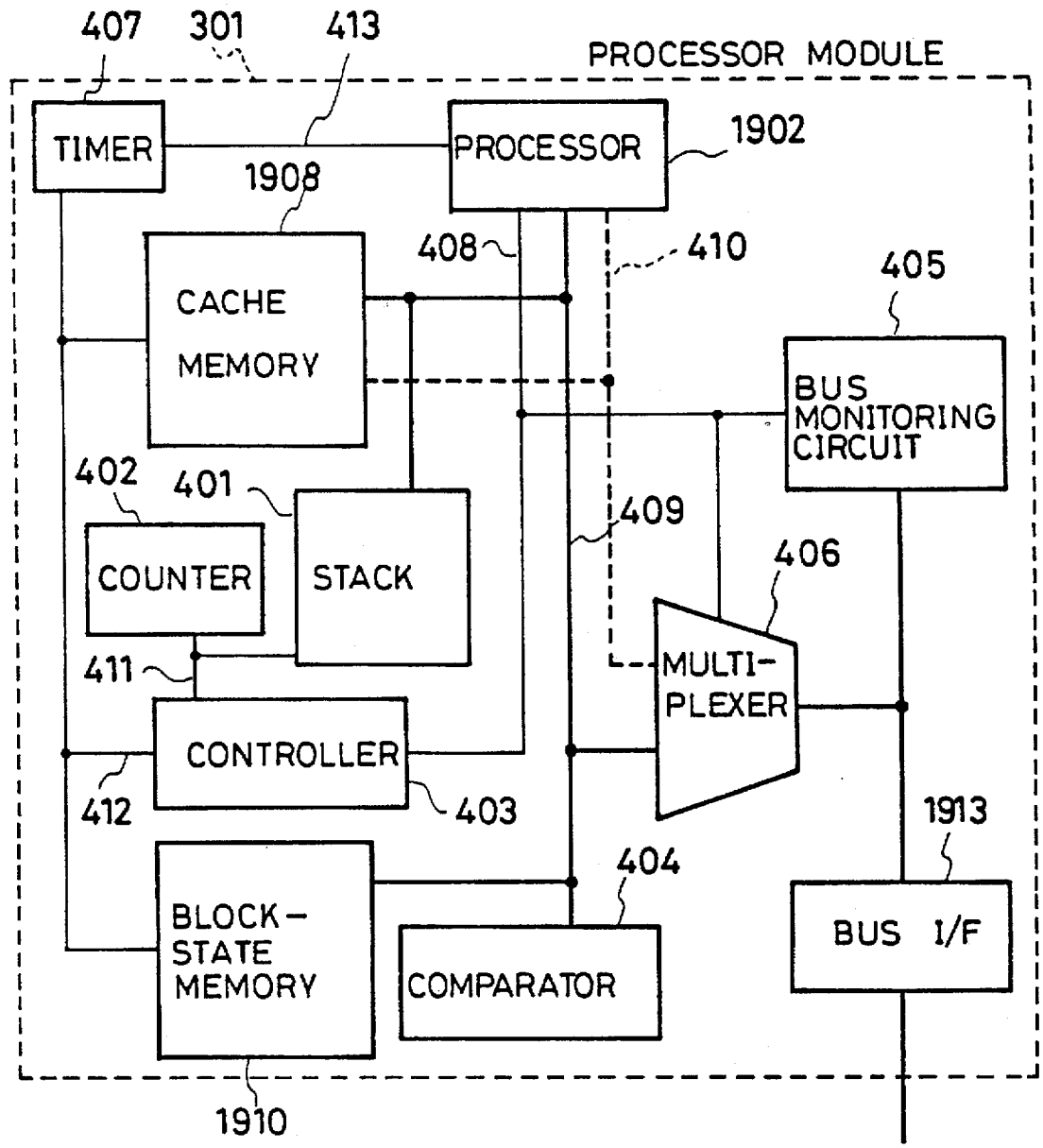
FIG. 4 is a block diagram showing a detailed arrangement of a processor module in FIG. 3.

FIG. 4 shows a detailed arrangement of the processor module where reference numerals 1902, 1908, 1910 and 1913 represent the same parts as in the prior art apparatus. In the illustration, 401 represents a stack (storage means) constituted by a FIFO (First-In First-Our) memory, for example, 402 designates a counter for counting the number of the updated cache blocks in the cache memory 1908, and 403 depicts a controller (control means) for the cache memory, 404 denotes a comparator for comparing the address of the data required by the processor 1902 with the address within the block-state memory 1910. Further 405 indicates a bus monitoring circuit for monitoring the operation of the other module coupled with the system bus to detect the time that operation is required in order to keep the matching of the data to inform the controller 403 or the processor 1902 that the operation is required, 406 is a multiplexer for combining the data and data to be supplied to the memory module, 407 is a timer for counting the elapse time, 408, 411 to 413 are control lines, 409 represents an address line, and 410 designates a data line.

Here, the processor 1902, cache memory 1908, and multiplexer 406 are coupled to each other by means of the data line 410. Further, the processor 1902, cache memory 1908, block-state memory 1910, multiplexer 406, comparator 404 and stack 401 are coupled to each other by means of the address line 409. Moreover, the processor 1902, controller 403, bus monitoring circuit 405, and multiplexer 406 are coupled to each other through the control line 408. The controller 403, stack 401 and counter 402 are coupled to each other through the control line 411. Further, the cache memory 1908, block-state memory 1910, controller 403 and timer 407 are coupled to each other by means of the control line 412. Still further, the processor 1902 and timer 407 are coupled to each other by means of the control line 413.

Figure 5:
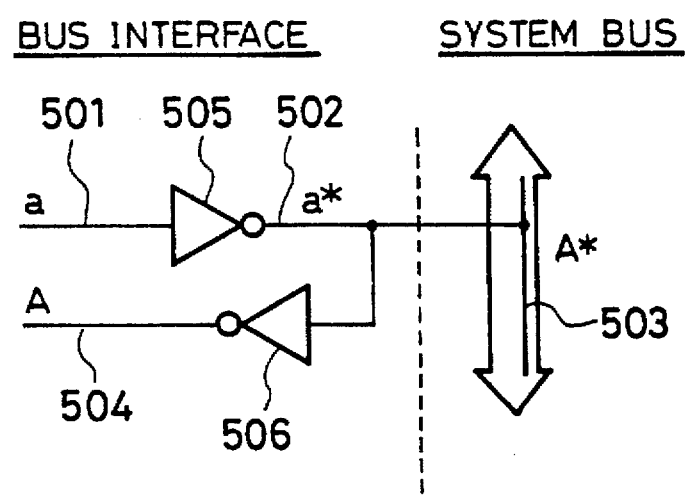
FIG. 5 is a circuit diagram for describing the signal states between a system bus interface and a system bus.

FIG. 5 is a circuit diagram for describing the signal state between the system bus interface 1913 and the system bus 302. In the illustration, a signal 503 on the system bus 302 is arranged such that in the negative logic the assert (valid) indicates a low level and the release (invalid) indicates a high level. In the following description the signal on the module is indicated by a sign of a small character and the signal on the system bus is indicated by a sign of a large character. Thus, an output signal 501 from the module is indicated by a, and this signal a becomes a negative logical signal a* at the output side 502 of a NOT circuit 505 and becomes a signal A* on the system bus 503. Further, a* and A* are wired-OR-coupled. That is, if at least one of the signals a* of all the bus interfaces coupled to the system bus 503 is asserted, A* enters into the low level state, and if all of a* are not released, A* does not enter into the high level.

Figure 6:
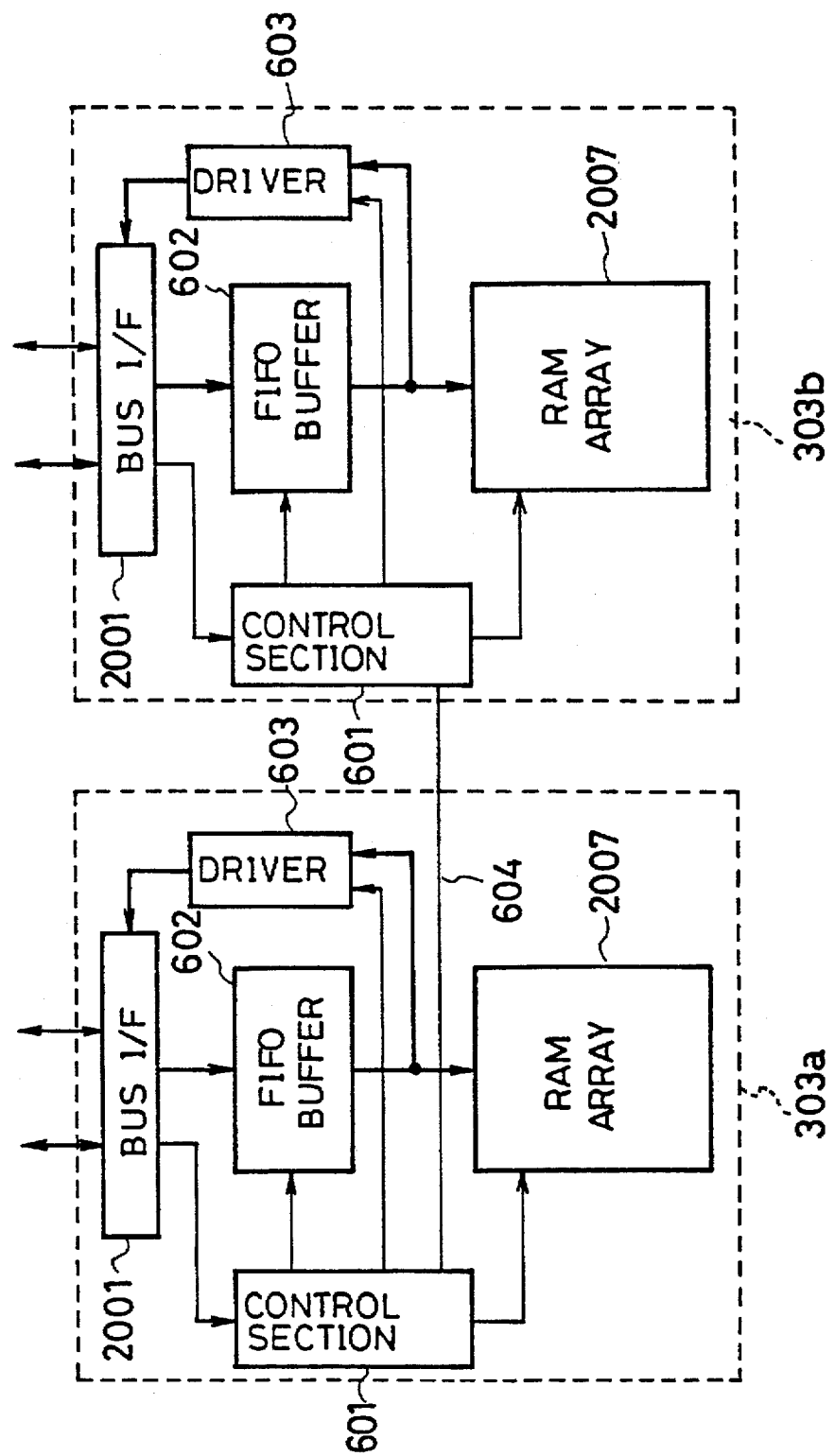
FIG. 6 is a block diagram illustrating a detailed arrangement of doubled memory modules in FIG. 3.

FIG. 6 shows a detailed arrangement of the doubled memory module 303 where 2001 and 2007 represents parts having the same structure as those in the above-mentioned prior art apparatus. In the illustration, 602 represents a FIFO buffer (buffer memory) for temporarily storing the data supplied through the system bus 302, 603 designates a driver for driving the data of the RAM array 2007 onto the system bus 302, 604 depicts a communication signal line (communication means) for the communication between the pair of memory modules, and 601 denotes a control section (control means) for controlling the read/write of the data with respect to the RAM array 2007 and further controlling the communication signal line 604 and the FIFO buffer 602 where the buffer memory is constituted by a FIFO memory. One of the pair of memory modules is the master and the other thereof is the slave. The master/slave are respectively confirmed by the control section 601. In the case that both are normal, the assert and release of the signal to the system bus 302 and the transfer of the data are represented by the master. The storage of the data is effected by both the memory modules.

Figure 7:
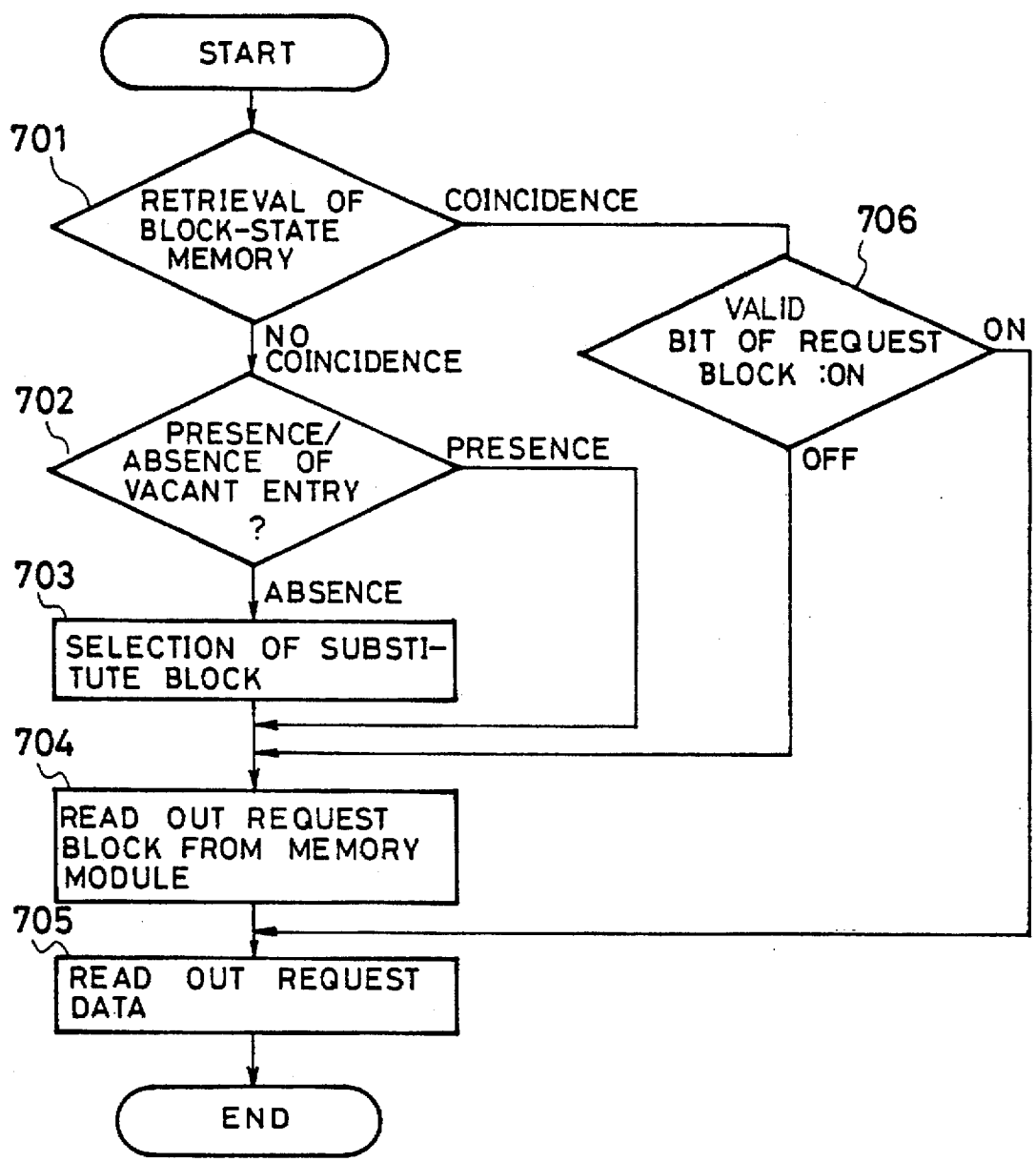
FIG. 7 is a flow chart showing the operation of the FIG. 4 embodiment to be executed in response to the read request of a processor.
Figure 22:
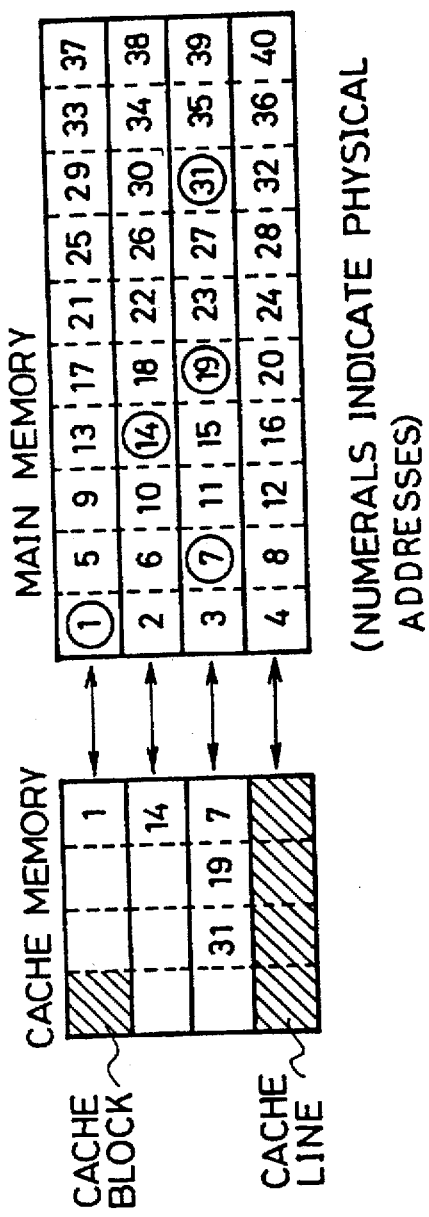
FIG. 22 is an illustration of the coordinate between a main memory and a cache memory.

As well as the conventional apparatus, the recovering method of this embodiment at the time of the occurrence of a trouble is arranged such that the state obtained when the system is normally operating is kept in the memory module (a recovery point is set) when a predetermined condition is satisfied (which will be described hereinafter) so that a different processor module resumes the process from the latest recovery point within the memory module in response to the generation of the trouble. Here, a description will be made in terms of the setting of the recovery point and the stack 401 illustrated in FIG. 4. The memory request from the processor 1902 is processed by the controller 403. The operation at the time of the read request due to the processor 1902 will be described with reference to FIG. 7. The controller 403 first checks whether the data requested is present in the cache memory 1908 (701). If the coincidence address is present in the block-state memory 1910 and the valid bit of the corresponding cache block is "ON" (706), the process is performed as well as in the conventional system and the data requested is immediately read out by the processor 1902 (705). If the valid bit of the cache block is "OFF", the cache block requested is read out from the memory module 303 via the system bus interface 1913 (704) and transferred to the processor 1902 while it is written in the cache memory 1908 (705). In the case that the data requested is absent in the cache memory 1908, it is checked whether a vacant entry is present in the cache memory 1908 (702). If there is a vacant entry, the operational flow advances to the above-mentioned process 704. If there is no vacant entry, the cache block where the modified bit is "OFF" and which is used at the beginning in the cache line is selected (703) and then the operational flow goes to the above-mentioned process 704. Here, the cache line or the like means a group of cache blocks for storing one block on the main memory (in the embodiment, memory module), and as illustrated in FIG. 22 which shows the correspondance between the main memory and the cache memory, the block on the main memory and the cache block are coordinated in advance.

Figure 9:
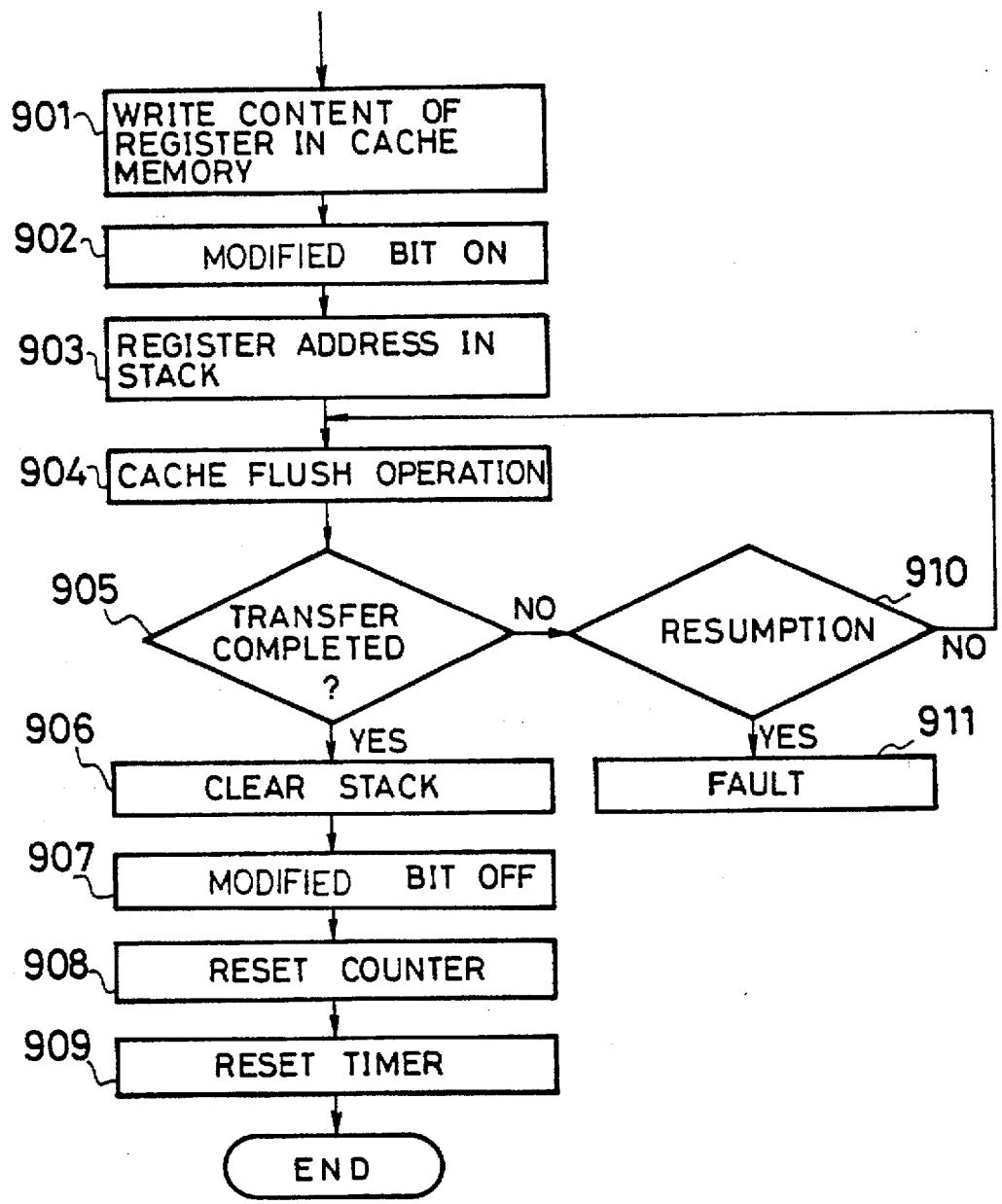
FIG. 9 is a flow chart showing the operation of the FIG. 4 embodiment to be executed at the time of the setting of the recovery point.

The operation taken at the time of the write request due to the processor 1902 will be described hereinbelow with reference to FIG. 8. The controller 403 first checks whether the data requested is present in the cache memory 1908 (801). In the case that the coincidence address is present in the block-state memory 1910, the valid bit of the cache block requested is checked (811). If the valid bit of the cache block is "ON", the modified bit is checked (812). If the modified bit is also "ON", the data from the processor 1902 is immediately written in that cache block (813). In the case that the valid bit is "ON" and the modified bit is "OFF", the modified bit is made to be "ON" (805), and the entry address of the cache block is registered to the stack 401 (806), and in addition the value of the counter 402 is incremented by one (807) and the data is written in that block (808). Thereafter, the number of the non-updated blocks in the cache line is checked (809). If it is not 1, the value of the counter 402 is compared with a predetermined value (810). If not coincident, the writing operation is terminated. In the case that in the process 809 the number of the non-updated blocks is 1 or in the process 810 the coincidence is detected, the setting of the recovery point is started as illustrated in FIG. 9. On the other hand, if the valid bit of the cache block requested is "OFF", the cache block corresponding to the address is read out from the memory module and the operation is shifted to the process 805. If the data requested by the processor 1902 is absent in the cache memory 1908, the decision is made in terms of whether a vacant entry is present in the cache memory 1908 (802). If there is the vacant entry, the operation shifted to the process 804. If no vacant entry, the cache block of the cache line in which the modified bit is "OFF" and which has been used at the beginning is selected (803) and then the operation flows to the process 804.

According to this embodiment, the recovery point is set in the case that the cache block of the cache line in which the modified bit is "OFF" becomes 1 after the above-mentioned cache block is updated or the number of the updated cache blocks within the cache memory reaches a predetermined value. Further, when these cases do not occur within a predetermined time period, the recovery point is also set by means of the timer 407 as illustrated in FIG. 9.

Here, although in this embodiment the processes 805 to 808 are arranged to be continuously effected, it is appropriate to perform these processes in parallel. In addition, in the embodiment, it is also appropriate that the number of the updated cache blocks within the cache memory is fixed by the system or is arranged to be programmable. Moreover, although the number of the non-updated cache blocks per the cache line is set to be 1, this embodiment is not limited thereto but it is enough if the non-updated cache block is present to output the internal register of the processor 1902 at the time of the setting of the recovery point.

Further, in the above-described embodiment, in the case that the bus monitoring circuit 405 is provided in the processor module as illustrated in FIG. 4 and the bus monitoring circuit 405 detects that the system bus 302 requests the updated cache block in the cache memory 1908, it is also possible to set the recovery point as illustrated in FIG. 9. In this case, the condition that the setting of the recovery point due to the bus monitoring circuit 405 is not made within a predetermined time period may be further added to the setting conditions of the recovery point due to the timer 407.

Here, a description will be made with reference to FIG. 9 in terms of the operation for setting the recovery point. When the recovery-point setting condition is satisfied as described above, the interrupt request is generated from the controller 403 or the timer 407 through the control lines 408 and 413 to the processor 1902. In response to the interrupt request, the processor 1902 interrupts the process and then writes into the non-updated cache block of the cache memory 1908 the contents of the internal register at the time of the reception of the interrupt request (901). The modified bit of the cache block in which the contents of the internal register are written is set to be "ON" (902) and the entry address of that block is registered in the stack 401 (903).

Figure 10:
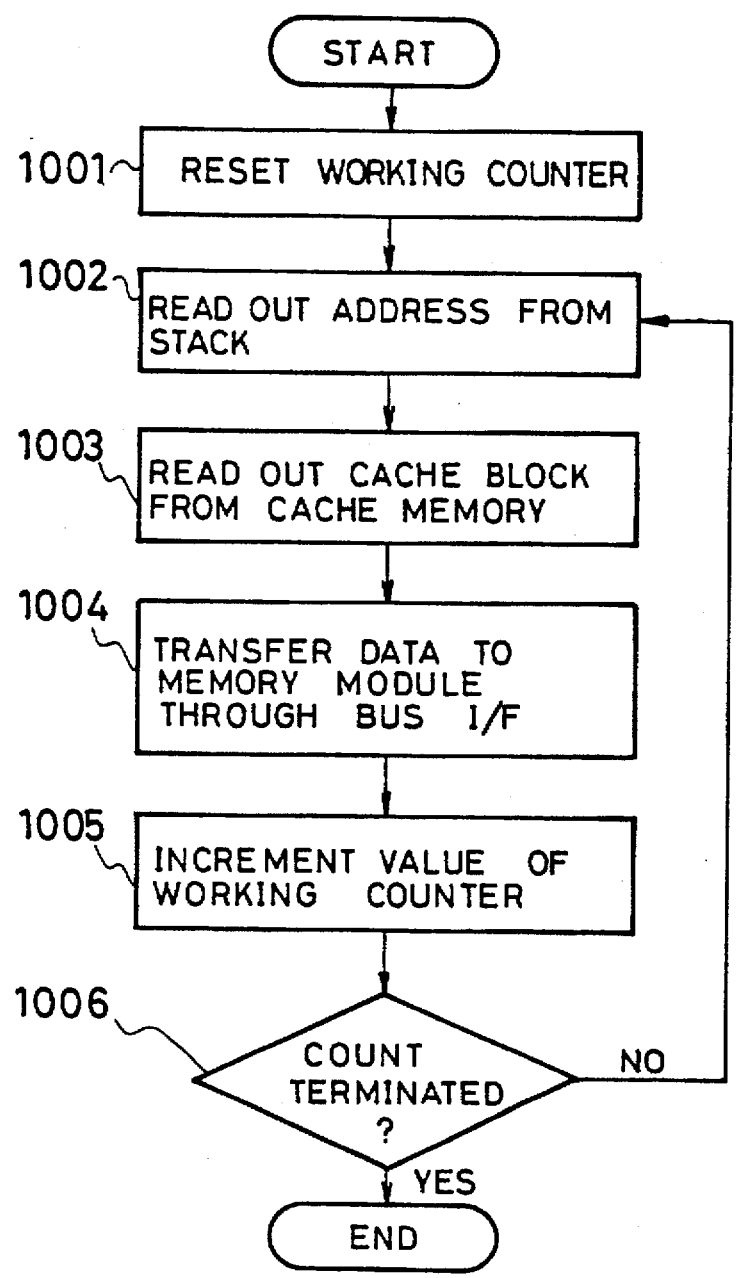
FIG. 10 is a flow chart indicating the cache flush operation in the FIG. 4 embodiment.
Figure 11:
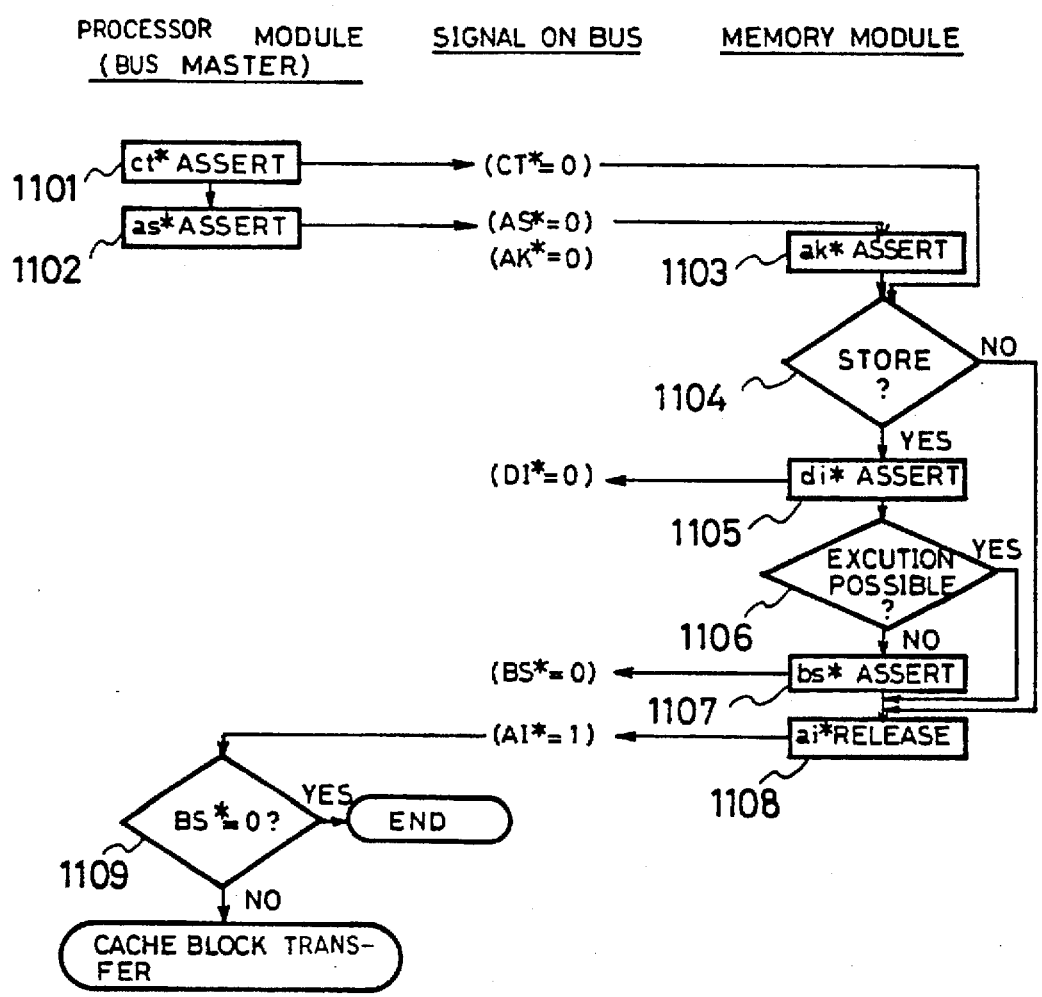
FIG. 11 is an illustration of flows of signals in the FIG. 3 embodiment at the time of the cache flush information.
Figure 12:
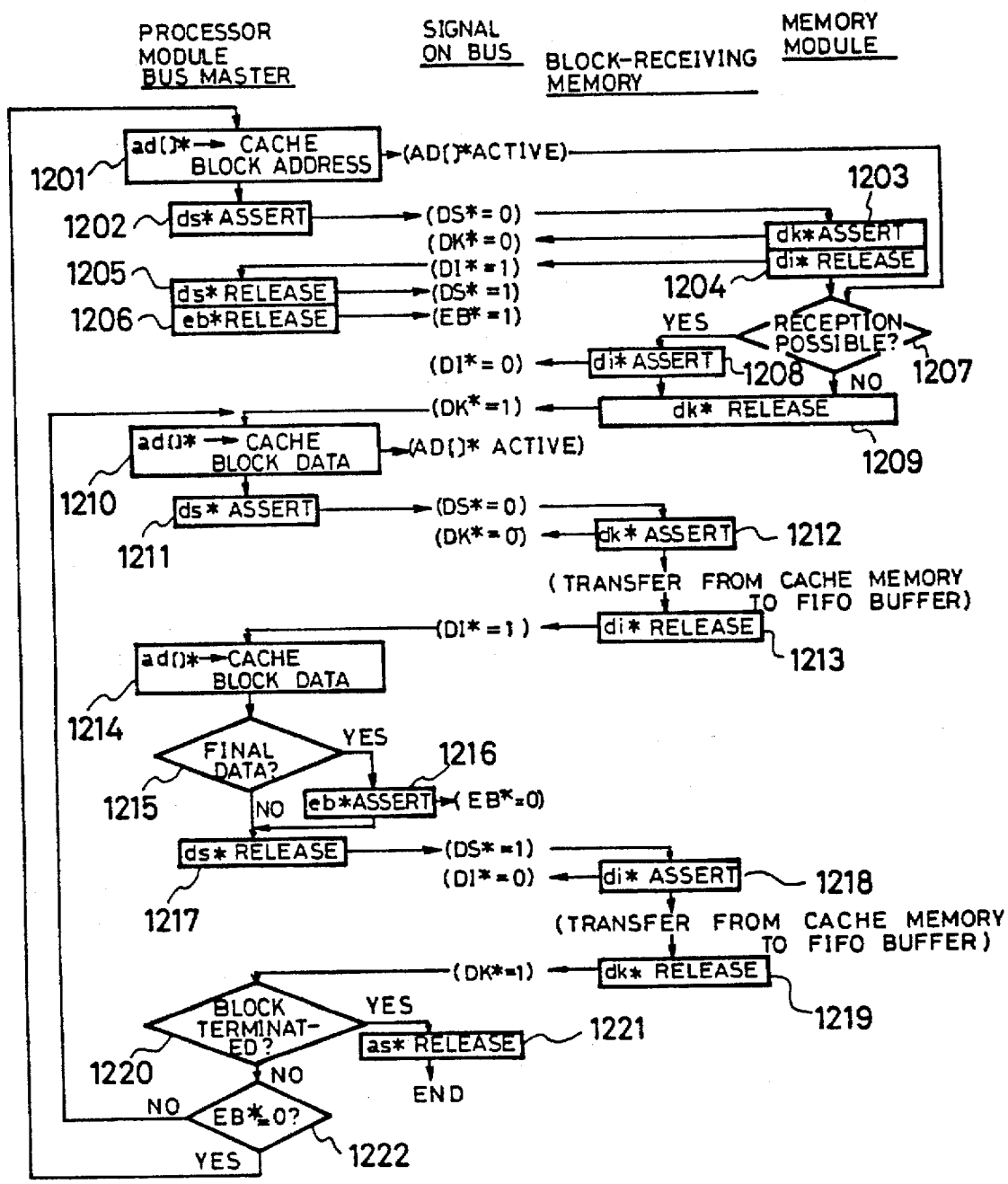
FIG. 12 is an illustration of flows of signals in the FIG. 3 embodiment at the time of the cache block transfer.
Figure 13:
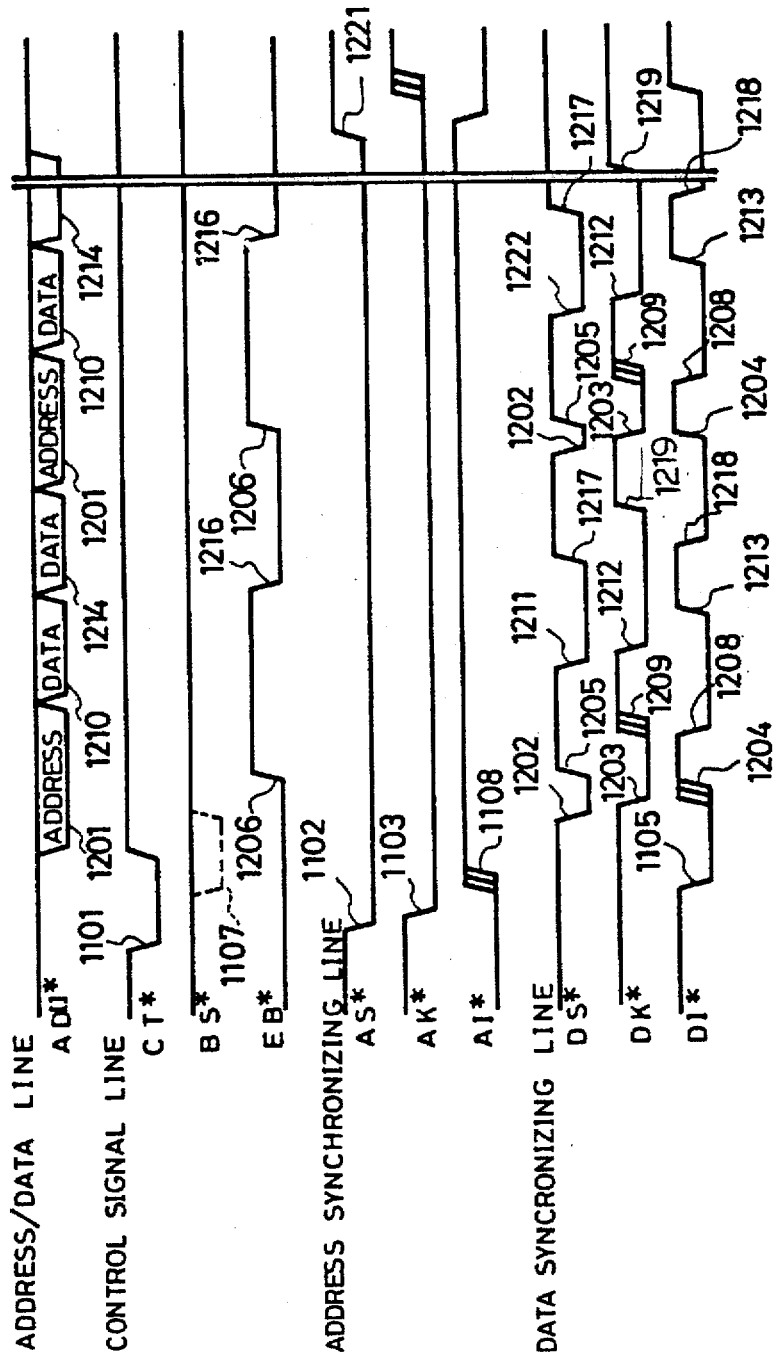
FIG. 13 is an illustration of timings of signals in FIG. 3 embodiment.

Secondly, a description will be made with reference to FIG. 10 in terms of the cache flush operation (904). The controller 403 is equipped with a working counter which is reset at the time of start of the cache flush operation (1001). The entry address of the cache block registered in the stack 401 is read out (1002) so that the cache block corresponding to that address is fetched from the cache memory 1908 (1003) so as to be transferred through the system bus interface 1913 to the pertinent memory module (1004). In response to the normal transfer, the working counter is incremented (1005) and it is checked whether the value of the working counter is coincident with the value of the counter 402 (1006). If not coincident, the process is repeatedly performed until reaching the coincidence. In response to the termination of the cache flush operation, it is checked whether the data is normally supplied or not (905). In the case of the normal termination, the entry of the stack 401 is cleared (906) and the modified bit is made to be "OFF" (907). Thereafter, the counter 402 is reset (908) and the timer 407 is reset (909). If terminated abnormally, the process is resumed one time (910). The second resuming process is treated as fault (911).

Further, a description will be made hereinbelow in terms of the communication operation between the memory modules. In FIG. 6, in the case that a signal is supplied from the processor module via the system bus 302, the master 303a and the slave 303b are independently arranged to be responsive to the supplied signal. In cases where the master 303a and the slave 303b normally receive the signal, the control section 601 sends the signal to the other section through the communication signal line 604. In the case that both receive the signal normally, the master 303a represents the implement of the operation. On the other hand, in this condition, the slave 303b does not implement the operation. In case that the signal is not supplied from the master 303a, the fact of the occurrence of a trouble is delivered through the system bus interface 2001 to the processor module.

Here, a description will be made in terms of the writing operation from the FIFO buffer 602 to the RAM array 2007. After the FIFO buffer 602 normally receives the cache block by the cache flush transaction, the control section 601 reads out the cache block from the FIFO buffer 602 to produce an error correction code which is in turn written in the RAM array 2007. This process is repeatedly performed until all the data of the FIFO buffer 602 are written in the RAM array 2007. Further, this operation is independently effected in both the memory modules 303a and 303b of the master and slave. The double-arranged memory modules supplies to each other the information indicative of the termination through the communication signal line 604. When both the memory modules confirm the normal termination, the master acquaints the processor module with the termination. Then, the contents of the FIFO buffer 602 is cleared.

The memory modules 303a and 303b of the master and slave independently receive the cache block from the system bus 302 to perform the parity check in the system bus interface 2001. In the case of the normal reception, both the memory modules 303a and 303b supply the signals to each other through the communication signal line 604. If the master 303a and the slave 303b normally receive the signals, the system bus interface 2001 of each of the master 303a and slave 303b returns a response to the system bus. If a parity error occurs in the master 303a and/or the slave 303b, the fact of the occurrence of the error is delivered to the processor module.

Further, if an error occurs in the writing operation from the FIFO buffer 602 to the RAM array 2007, the writing operation of the cache block from the FIFO buffer 602 is resumed from the beginning of the process again. If failure occurs in spite of repeating the process predetermined times, the consideration is made as the occurrence of a fixed trouble, and hence it is separated from the system. The master 303a and the slave 303b receive the mutual states through the communication signal line 604. In case that the slave 303b is separated from the system, the master 303a stops the communication therewith and singly performs the operation. On the other hand, if the master 303a is separated from the system, the slave 303b acts as the master to singly perform the operation.

Here, although in this embodiment the buffer memory is constructed with the FIFO memory, it is also appropriate to construct it with a static RAM.

Still further, the operation on the system bus 302 will be described hereinbelow with reference to FIGS. 11 to 14. In the following description the assert and release of the signal due to the memory module is effected by the master after the communication between the memory modules doubled. In the illustrations, "=0" indicates a low level and "=1" indicates a high level.

The processor module obtaining the use right of the system bus 302 asserts the cache flush transaction signal ct* (1101) and gives the notification of the cache flush transaction. Further, an address synchronizing signal as* is asserted (1102). When detecting that AS* on the system bus 302 turns to the low level, the memory module asserts an address synchronizing signal ak* (1103) to give the notification indicative of the reception and then decodes the information on the system bus. Here, all the memory modules know the cache flush transaction because CT* is the low level (1104) and assert a data synchronizing signal di* (1105). If the execution is impossible (1106), a busy signal bs* is asserted (1107) to provide the resuming request with respect to the processor module. Thereafter, all the memory modules release the address synchronizing signal ai* (1108) to give the notification that the decision of the participation/ nonparticipation to the transaction is completed. The processor module detects that AI* turns to the high level and then confirms that BS* is the high level (1109), thereafter entering into the transfer cycle. If BS* is the low level, the process is terminated and then resumed after elapse of a time.

Subsequently, the cache block transfer (FIG. 12) is started. The processor module outputs to an address/data bus ad[ ]* the address of the updated cache block to be transferred to the memory (1201) and asserts the data synchronizing signal ds* (1202). When detecting that DS* turns to the low level, the memory module asserts the data synchronizing signal dk* (1203) and releases di* (1204). At this time, the memory module decodes the address and the memory module having a space for storing that cache block asserts the data synchronizing signal di* (1207, 1208). All the memory modules release the data synchronizing signal dk* (1209) and gives the information indicative of the fact that the decision of the allowance/inhibition of the transfer with respect to the address is completed. The processor module releases the data synchronizing signal ds* and a block end signal eb* at the timing that DI* turns to the high level (1205, 1206).

The transaction enters into the cache-block data transfer state. The processor module detects that DK* turns to the high level and then outputs the cache block data to the address/data bus ad[ ]* (1210) and inverts the data synchronizing signal ds* (1211). The memory module which is responsive to the address asserts the data synchronizing dk* (1212) to give the notification of the reception, and further writes the cache block data into the FIFO buffer 602 and releases the data synchronizing signal di* (1213). The processor module detects that DI* turns to the high level and then outputs the next cache block data (1214) and inverts ds* (1217). The memory module which is responsive to the address asserts the data synchronizing signal di* (1218) to give the notification of the reception, and further writes the cache block data in the FIFO buffer 602 and releases the data synchronizing signal dk* (1219). The aforementioned cache block transfer is repeatedly performed until all the cache block data are transferred (1222).

At the time of transferring the last data of the cache block (1215), the processor module asserts the block end signal eb* (1216). After the transfer of the last data of the cache block, the processor module outputs the address of the next cache block to the address/data bus ad[ ]* (1201) and asserts the data synchronizing signal ds* (1202). When detecting that DS* and EB* turn to the low level, the memory module asserts the data synchronizing signal dk* (1203) and releases di* (1204). The memory module decodes the address to allow the reception and repeat the cache block transfer. After the termination of the transfer of all the updated cache blocks, the processor module releases the address synchronizing signal as* (1221) and releases the bus. After the termination of the transfer from the FIFO buffer 602 to the RAM array 2007 which is processed in the memory module, the processor module terminates the transaction.

Figure 14:
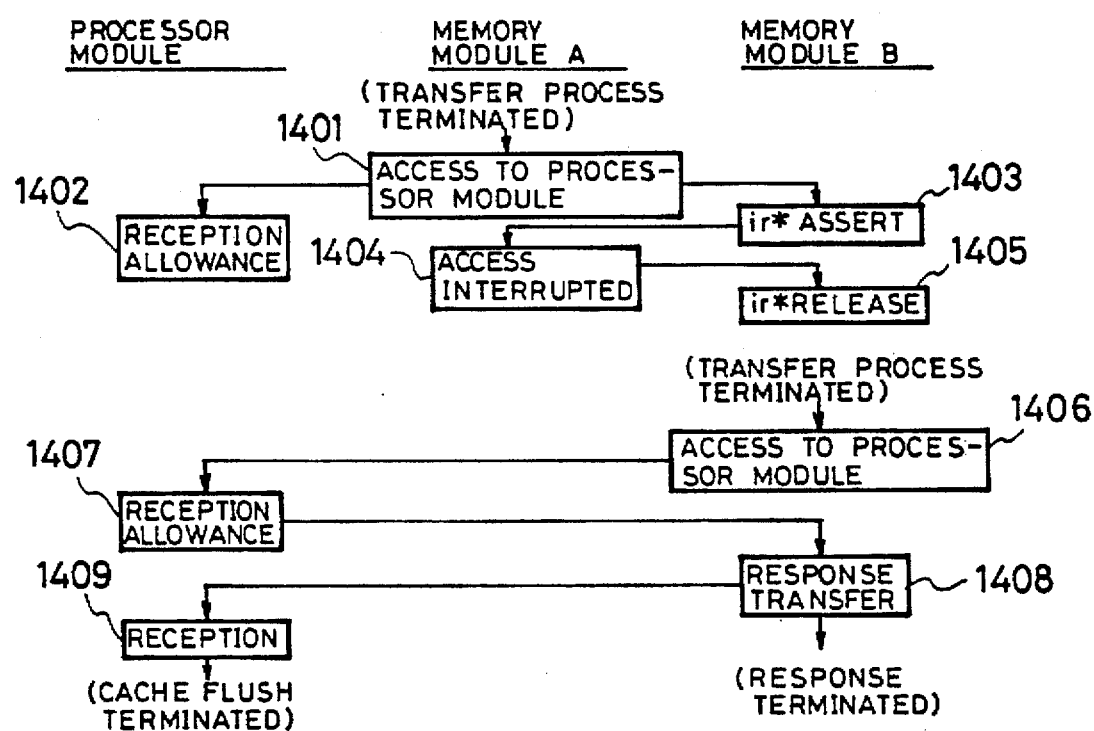
FIG. 14 is an illustration of a distributed response operation in the FIG. 3 embodiment.

In the case that the memory module requires a long time for the transfer from the FIFO buffer 602 to the RAM array 2007 so that the response to the processor module is delayed, the distribution response is selected. In this case, the processor module terminates the transaction without waiting for the response from the memory module. At the time of the termination of the transfer process, the memory module accesses the processor module through the system bus 302 to return the termination response. In FIG. 14, in the case that one of the memory modules is in the process-completed state and the other memory module is in the processing state, the non-completed memory module detects the access (termination signal) of the process-completed memory module to the processor module (1410) to assert a response invalid request ir* (1403). The process-completed memory module detects that ir* is the low level and then interrupts the response process (1404). The access (1406) of the subsequently completed memory module to the processor module becomes valid, and the cache flush process is terminated when the processor module receives that response (1409).

Here, in the data transfer system for the cache flush operation, the cache flush information means, the cache block transfer means and response means are realized by the controller 403, processor 1902 within the processor module and the control section 601 within the memory module.

In the cache controller of this invention, there are provided the storage means for storing the entry address of the updated cache block and the control means for registering the entry address of the updated cache block in the aforementioned storage means and further for performing the cache flush transfer with respect to the registered entry address with reference to the storage means at the time of the cache flush, whereby it is possible to shorten the time required for the cache flush and further to perform the process at a high speed with a reliability being kept.

Further, the fault tolerant computer of this invention is equipped with the similar storage means and control means to thereby allow performing the cache flush operation at a high speed.

In addition, with the counter for counting the number of the updated cache blocks, the timer for measuring the elapse time and the bus monitoring circuit for monitoring the system bus, the recovery point is set under the condition that the number of the cache blocks of the cache memory which are not updated at the respective lines reaches a predetermined value, the total number of the updated cache blocks in the cache memory reaches a predetermined value, a different processor module refers to the updated cache block in the cache memory through the system bus or any one of the aforementioned cases does not occur within a predetermined time period. Thus, it is possible to ensure the maximum interval of the recovery points to realize the real time performance.

Moreover, with the buffer memory being provided in the memory module and doubled in the same physical space, the cache flush transaction due to the cache flush operation can be completed only one time, thereby reducing the time required for the setting of the recovery point.

Furthermore, the processor module for performing the cache flush operation designates the cache flush transaction, and in response to the designation, all the pertinent memory modules select the cache flush information means for preparing the reception of the cache flush and the memory module for storing the cache block with the transfer of the cache block address, and the cache block transfer means is provided which continuously execute the transfer cycle of the cache block in which the data transfer of the cache block is effected, whereby the cache flush can be implemented by performing the bus transaction only one time, which can reduce the time required for the setting of the recovery point.

Still further, with the cache block transfer means the cache block is transferred to the buffer memory, and after the termination of the transaction, the memory module performs the data transfer from the buffer memory to the ram array and again obtains the bus after the completion of the process, and the response means for returning the response to the processor module clears the system bus, whereby it is possible to effectively use the system bus.

What is claimed is:

1. A fault tolerant computer comprising:

a plurality of processor modules; and a system bus connecting said processor modules;

wherein each processor module includes a write-back cache memory, and a cache controller for controlling said cache memory, said cache controller including a stack for storing entry addresses in a series of locations having contiguous physical addresses, an entry address stored therein pointing to the updated cache block in cache memory, and control means for registering the entry address of the updated cache block in said stack and for performing a cache flush transfer using the registered entry address to locate the updated cache block.

2. A fault tolerant computer according to claim 1, further including a main memory connected to said system bus; wherein each processor module further includes an interface circuit connected to said system bus, said cache controller further including a comparator connected between the tag memory and the control means and a bus monitor connected between the system bus and the control means, wherein said stack is held in a FIFO memory.

3. A fault tolerant computer according to claim 1 wherein said stack is held in a FIFO memory.

4. A fault tolerant computer comprising:

a plurality of processor modules; and a plurality of memory modules;

wherein each processor module includes a processor, a write-back type cache memory, a stack for storing entry addresses in a series of locations having contiguous physical addresses, an entry address stored therein pointing to the updated cache block in cache memory, and control means for registering the entry address of the updated cache block and for transferring to said memory modules the updated cache block corresponding to the registered entry address at the time of a cache flush.

* * * * *